United States Patent
Furuya

(10) Patent No.: US 10,797,711 B2
(45) Date of Patent: Oct. 6, 2020

(54) OSCILLATOR, ELECTRONIC APPARATUS, AND VEHICLE

(71) Applicant: SEIKO EPSON CORPORATION, Tokyo (JP)

(72) Inventor: Yasunari Furuya, Fujimi-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/697,291

(22) Filed: Nov. 27, 2019

(65) Prior Publication Data

US 2020/0177191 A1  Jun. 4, 2020

(30) Foreign Application Priority Data

Nov. 29, 2018 (JP) ................... 2018-222995

(51) Int. Cl.
*H03L 7/099* (2006.01)
*H03M 3/00* (2006.01)
(Continued)

(52) U.S. Cl.
CPC .......... *H03L 7/099* (2013.01); *H01L 41/0475* (2013.01); *H03B 5/364* (2013.01);
(Continued)

(58) Field of Classification Search
CPC ....... H03B 5/326; H01L 2924/00; H01L 1/00; H01L 41/0475; H03L 7/18; H03L 7/099; H03M 3/30
(Continued)

(56) References Cited

U.S. PATENT DOCUMENTS 9,490,820 B2 * 11/2016 Shiozaki ............... H03L 7/0802
2006/0132248 A1 * 6/2006 Lichter ................. H03B 5/326
331/107 A
(Continued)

FOREIGN PATENT DOCUMENTS

JP    2008-306231 A    12/2008
JP    2015-115824 A    6/2015
(Continued)

OTHER PUBLICATIONS

Understanding Delta-Sigma Modulators, Electronic Design( Arash LoLoee) (Year: 2013).*
(Continued)

*Primary Examiner* — Arnold M Kinkead
(74) *Attorney, Agent, or Firm* — Oliff PLC

(57) ABSTRACT

An oscillator includes a quartz crystal resonator and a circuit device, and the circuit device includes an oscillation circuit and a PLL circuit. The PLL circuit includes a phase comparison circuit that performs a phase comparison between the reference clock signal and a feedback clock signal, a control voltage generation circuit that generates a control voltage based on a result of the phase comparison, and a voltage control oscillation circuit that generates a clock signal having a frequency corresponding to the control voltage, and a frequency division circuit that divides a frequency of the clock signal and outputs the feedback clock signal. An oscillation frequency of the quartz crystal resonator is higher than or equal to 200 MHz, and a phase comparison frequency of the phase comparison circuit is higher than or equal to 200 MHz.

13 Claims, 18 Drawing Sheets

(51) Int. Cl.
*H03B 5/36* (2006.01)
*H01L 41/047* (2006.01)
*H03L 7/18* (2006.01)

(52) U.S. Cl.
CPC ............... *H03L 7/18* (2013.01); *H03M 3/30* (2013.01); *H01L 2924/00* (2013.01)

(58) Field of Classification Search
USPC .......................... 331/107 A, 167, 117 FE, 18
See application file for complete search history.

(56) References Cited

U.S. PATENT DOCUMENTS

| 2010/0019300 A1* | 1/2010 | Yu ....................... H01L 23/5227 257/296 |
| 2016/0079988 A1* | 3/2016 | Shiozaki ............... H03L 7/0802 327/156 |

FOREIGN PATENT DOCUMENTS

| JP | 2016-059020 A | 4/2016 |
| JP | 2017-175406 A | 9/2017 |

OTHER PUBLICATIONS electronicdesign.com/technologies/analog/article/21798185/understanding-deltasigma-modulators. Lolee understanding Delta-Sigma Modulators, (Jul. 15, 2013) Electroinic Design Article.*
Lolee, "Understanding Delta Sigma Modulators", Electronic Design (Jul. 15, 2013).*

* cited by examiner

| fpfd | 100MHz | 200MHz | 400MHz |
|---|---|---|---|
| fxtal | 100MHz | 200MHz | 400MHz |
| fvco | 5850MHz | 5850MHz | 5850MHz |
| DIV(NN) | 58.5 | 29.25 | 14.625 |
| fleak | 100MHz | 200MHz | 400MHz |
| fdsm | 50MHz | 100MHz | 200MHz |
| fbw | 0.5MHz | 1MHz | 2MHz |

FIG. 12

| fpfd(MHz) | fbw(MHz) | RD1(Ω) | RD2(Ω) | CD1(pF) | CD2(pF) | CD3(pF) | Phase margin (deg) |
|---|---|---|---|---|---|---|---|
| 100 | 0.5 | 220 | 220 | 4000 | 40 | 20 | 66 |
| 200 | 1.0 | 220 | 220 | 2000 | 40 | 20 | 62 |
| 400 | 2.0 | 220 | 220 | 1000 | 40 | 10 | 60 |

FIG. 19
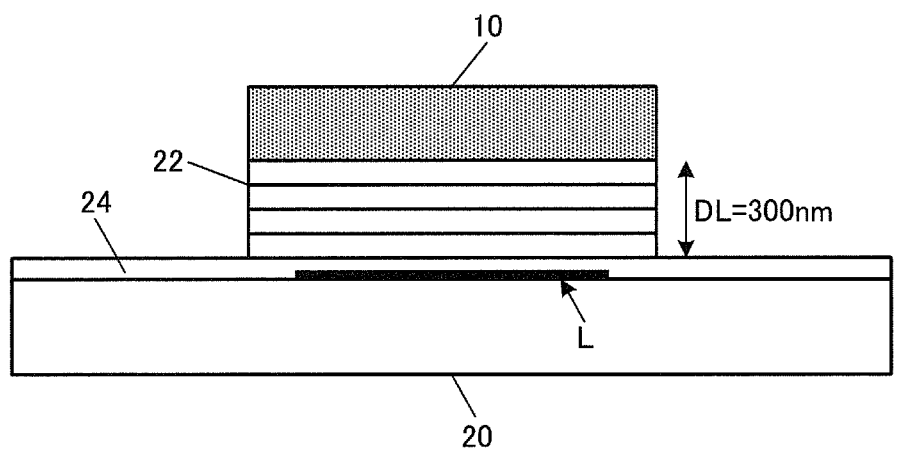
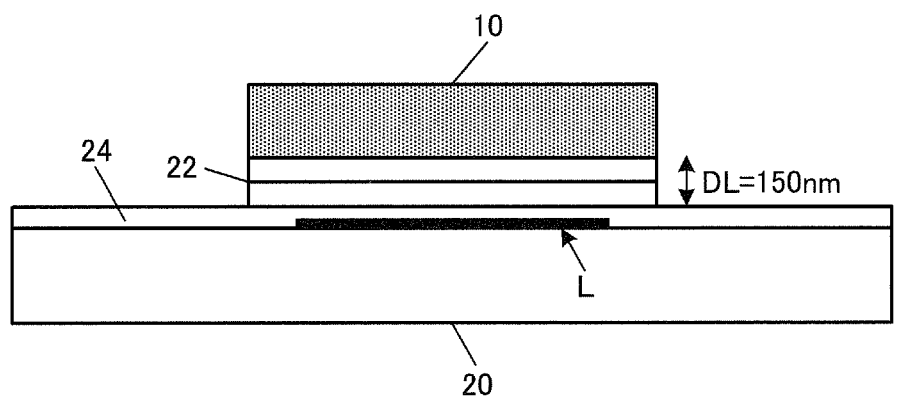
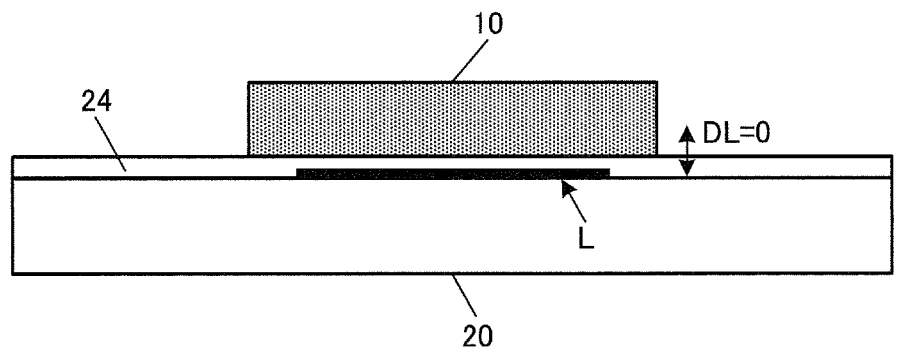

FIG. 20

| DL | OSCILLATION FREQUENCY | NOISE |
|---|---|---|
| NO QUARTZ CRYSTAL RESONATOR | f0 | NO |
| 300 μm | f0 | NO |
| 150 μm | f0+1% | NO |
| 0 μm | NO OSCILLATION | NO OSCILLATION |

OSCILLATOR, ELECTRONIC APPARATUS, AND VEHICLE

The present application is based on, and claims priority from JP Application Serial Number 2018-222995, filed Nov. 29, 2018, the disclosure of which is hereby incorporated by reference herein in its entirety.

BACKGROUND

1. Technical Field

The present disclosure relates to an oscillator, an electronic apparatus, and a vehicle.

2. Related Art

A PLL circuit performs a phase comparison between a reference clock signal and a feedback signal to generate a clock signal having a frequency obtained by multiplying a frequency of the reference clock signal. In order to make the clock signal generated by the PLL circuit highly accurate, the reference clock signal input to the PLL circuit may be generated by using a quartz crystal resonator. In this case, a vibrator of an oscillation frequency of approximately 50 MHz was used as the quartz crystal resonator used in the PLL circuit. For example, although a study such as adding a doubler circuit for doubling the oscillation frequency was performed, a phase comparison frequency of the PLL circuit was approximately 100 to 120 MHz at maximum.

For example, JP-A-2016-59020 discloses a fractional-N type PLL circuit capable of appropriately setting an operation range of a voltage control oscillation circuit without excessively increasing a frequency at which a delta sigma modulation is performed. In the PLL circuit, a frequency of the reference clock signal input to the PLL circuit is 100 MHz, and the phase comparison frequency of the PLL circuit is 100 MHz. By setting a frequency division ratio of a frequency division circuit, for example, 34.25, a clock signal having a frequency of 3425 MHz is output from the PLL circuit.

However, in the PLL circuit of JP-A-2016-59020, a reference leak noise having a frequency of 100 MHz which is a phase comparison frequency, and a delta sigma modulator (DSM) noise having a frequency of 50 MHz, which is a half of the phase comparison frequency, as a peak are generated. If the reference leak noise or the DSM noise is generated, noise reduction of the clock signal generated by the PLL circuit is hindered.

SUMMARY

An aspect of the present disclosure relates to an oscillator including a quartz crystal resonator, and a circuit device electrically coupled to the quartz crystal resonator, in which the circuit device includes an oscillation circuit that generates a reference clock signal by oscillating the quartz crystal resonator, and a PLL circuit that receives the reference clock signal, the PLL circuit includes a phase comparison circuit that performs a phase comparison between the reference clock signal and a feedback clock signal, a control voltage generation circuit that generates a control voltage based on a result of the phase comparison, and a voltage control oscillation circuit that generates a clock signal having a frequency corresponding to the control voltage, and a frequency division circuit that divides a frequency of the clock signal and outputs the feedback clock signal, and an oscillation frequency of the quartz crystal resonator is higher than or equal to 200 MHz, and a phase comparison frequency of the phase comparison circuit is higher than or equal to 200 MHz.

BRIEF DESCRIPTION OF THE DRAWINGS

FIG. 12 illustrates an example of the phase comparison frequency, a loop bandwidth of a low pass filter, and respective constants of the low pass filter.

FIG. 19 is an explanatory diagram of an experiment performed by changing a distance between a quartz crystal resonator and the inductor.

FIG. 20 is a diagram illustrating results of the experiment performed by changing the distance between the quartz crystal resonator and the inductor.

DESCRIPTION OF EXEMPLARY EMBODIMENTS

Hereinafter, the present embodiment will be described. The present embodiment described below does not unduly limit contents described in the appended claims. All of configurations described in the present embodiment are not essential configuration requirements.

1. Oscillator

Figure 1:
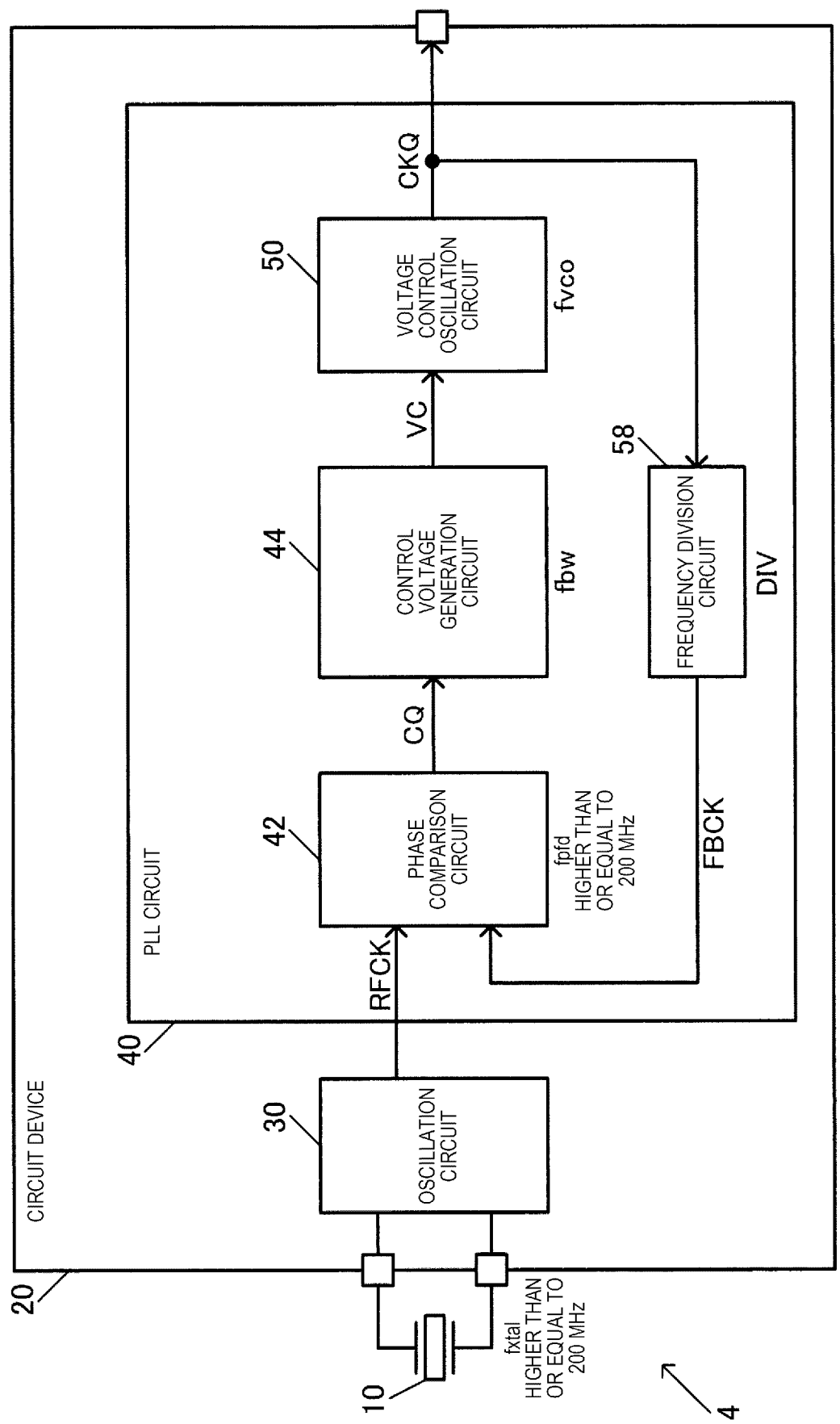
FIG. 1 illustrates a configuration example of an oscillator according to the present embodiment.

FIG. 1 illustrates a structure example of an oscillator 4 according to the present embodiment. The oscillator 4 includes a circuit device 20 and a quartz crystal resonator 10. The quartz crystal resonator 10 which is a vibrator is electrically coupled to the circuit device 20. For example, the quartz crystal resonator 10 and the circuit device 20 are electrically coupled to each other by using internal wiring of a package that accommodates the quartz crystal resonator 10 and the circuit device 20, a bonding wire, a metal bump, or the like.

The quartz crystal resonator 10 is a piezoelectric vibration element that generates a mechanical vibration in response to an electrical signal and can be realized by a quartz crystal vibrator element. Specifically, the quartz crystal resonator 10 can be realized by a quartz crystal vibration element in which a cut angle performs a thickness-shear vibration such as AT cut or SC cut. The oscillator 4 including the quartz crystal resonator 10 may be a simple packaged crystal oscillator (SPXO), a temperature compensated crystal oscillator (TCXO) not including a thermostat, or an oven-controlled crystal oscillator (OCXO) including the thermostat.

The circuit device 20 is an integrated circuit device called an integrated circuit (IC). For example, the circuit device 20 is an IC manufactured through a semiconductor process and is a semiconductor chip in which a circuit element is formed on a semiconductor substrate. The circuit device 20 includes an oscillation circuit 30 and a PLL circuit 40. The circuit device 20 may have a circuit block other than the oscillation circuit 30 and the PLL circuit 40.

The oscillation circuit 30 oscillates the quartz crystal resonator 10 to generate a reference clock signal RFCK. That is, the oscillation circuit 30 vibrates the quartz crystal resonator 10 to generate the reference clock signal RFCK which is an oscillation signal. For example, when an oscillation frequency of the quartz crystal resonator 10 is referred to as FXTAL, a frequency of the reference clock signal RFCK is also referred to as FXTAL. The oscillation circuit 30 may be provided with a doubler circuit or the like, and in this case, a frequency of the reference clock signal RFCK becomes, for example, 2×FXTAL. For example, the circuit device 20 includes terminals for coupling first and second vibrators, and a first terminal electrode, which is one end of the quartz crystal resonator 10 that is an external component of the circuit device 20, is coupled to a terminal for being coupled to the first vibrator, and a second terminal electrode, which is the other end of the quartz crystal resonator 10, is coupled to a terminal for being coupled to the second vibrator. The terminals for being coupled to the first and second vibrators are, for example, pads of the circuit device 20. The oscillation circuit 30 includes an oscillation drive circuit and the like provided between the terminal for being coupled to the first vibrator and the terminal for being coupled to the second vibrator. A detailed configuration example of the oscillation circuit 30 will be described below.

The PLL circuit 40 receives the reference clock signal RFCK. An operation of s phase locked loop (PLL) is performed. For example, the PLL circuit 40 generates a clock signal CKQ having a frequency obtained by multiplying the frequency of the reference clock signal RFCK. That is, the PLL circuit generates the clock signal CKQ with a high accuracy phase-locked to the reference clock signal RFCK. The PLL circuit 40 includes a phase comparison circuit 42, a control voltage generation circuit 44, a voltage control oscillation circuit 50, and a frequency division circuit 58.

The phase comparison circuit 42 compares a phase between the reference clock signal RFCK and a feedback clock signal FBCK. For example, the phase comparison circuit 42 compares phases of the reference clock signal RFCK and the feedback clock signal FBCK, and outputs a signal CQ corresponding to a phase difference between the reference clock signal RFCK and the feedback clock signal FBCK as a signal of the phase comparison result. The signal CQ corresponding to the phase difference is, for example, a pulse signal having a pulse width proportional to the phase difference.

The control voltage generation circuit 44 generates a control voltage VC based on the phase comparison result of the phase comparison circuit 42. For example, the control voltage generation circuit 44 performs a charge pump operation and filter processing based on the signal CQ of the phase comparison result from the phase comparison circuit 42 and generates the control voltage VC for controlling oscillation of the voltage control oscillation circuit 50.

The voltage control oscillation circuit 50, which is a voltage controlled oscillator (VCO), generates a clock signal CKQ having a frequency corresponding to the control voltage VC. For example, the voltage control oscillation circuit performs an oscillation operation based on the control voltage VC from the control voltage generation circuit 44 and generates the clock signal CKQ. For example, the voltage control oscillation circuit 50 generates the clock signal CKQ having a frequency that changes according to the control voltage VC by performing an oscillation operation. As an example, the voltage control and oscillation circuit 50 includes a variable capacitance element such as a varactor, and when capacitance of the variable capacitance element changes based on the control voltage VC, a frequency of the clock signal CKQ changes which is an oscillation signal generated by the oscillation operation of the voltage control oscillation circuit 50.

The frequency division circuit 58 divides a frequency of the clock signal CKQ and outputs the feedback clock signal FBCK. For example, the frequency division circuit 58 outputs a signal having a frequency obtained by dividing the frequency of the clock signal CKQ by a frequency division ratio set by frequency division ratio data as the feedback clock signal FBCK. For example, when an oscillation frequency of the voltage control oscillation circuit 50 is referred to as FVCO and the frequency division ratio of the frequency division operation of the frequency division circuit 58 is referred to as DIV, the frequency of the feedback clock signal FBCK becomes FVCO/DIV. As described above, the phase comparison circuit 42 compares phases of the reference clock signal RFCK from the oscillation circuit 30 and the feedback clock signal FBCK from the frequency division circuit 58. For example, the phase comparison circuit 42 performs a phase comparison operation at the phase comparison frequency FPFD. The phase comparison frequency FPFD is equal to, for example, the frequency of the feedback clock signal FBCK, and FPFD=FVCO/DIV.

In the present embodiment, the oscillation frequency FXTAL of the quartz crystal resonator 10 is higher than or equal to 200 MHz, and the phase comparison frequency FPFD of the phase comparison circuit 42 is higher than or equal to 200 MHz. For example, although a general-purpose quartz crystal resonator used in general has an oscillation frequency of approximately 50 MHz, the quartz crystal resonator 10 according to the present embodiment oscillates with the oscillation frequency FXTAL higher than or equal to 200 MHz by using, for example, a structure illustrated in FIG. 21 which will be described below. For example, while a film thickness of an excitation electrode is reduced, film thicknesses of a lead electrode and a terminal electrode that are not related to vibration are increased. Thereby, a film resistance is reduced and a value of crystal impedance (CI) is increased to realize the oscillation frequency FXTAL higher than or equal to 200 MHz. The oscillation frequency FXTAL is, for example, an oscillation frequency in a fundamental wave mode, not a harmonic mode. Specifically, the oscillation frequency FXTAL is, for example, an oscillation frequency in a fundamental wave mode of a thickness-shear vibration. The phase comparison frequency FPFD is a frequency corresponding to a cycle of the phase comparison operation of the phase comparison circuit 42, and corresponds to, for example, the frequencies of the reference clock signal RFCK and the feedback clock signal FBCK. For example, when a doubler circuit or the like of the oscillation frequency is provided in the oscillation circuit 30, the frequency of the reference clock signal RFCK does not coincide with the oscillation frequency FXTAL, and becomes, for example, twice the oscillation frequency FXTAL or the like.

Figure 2:
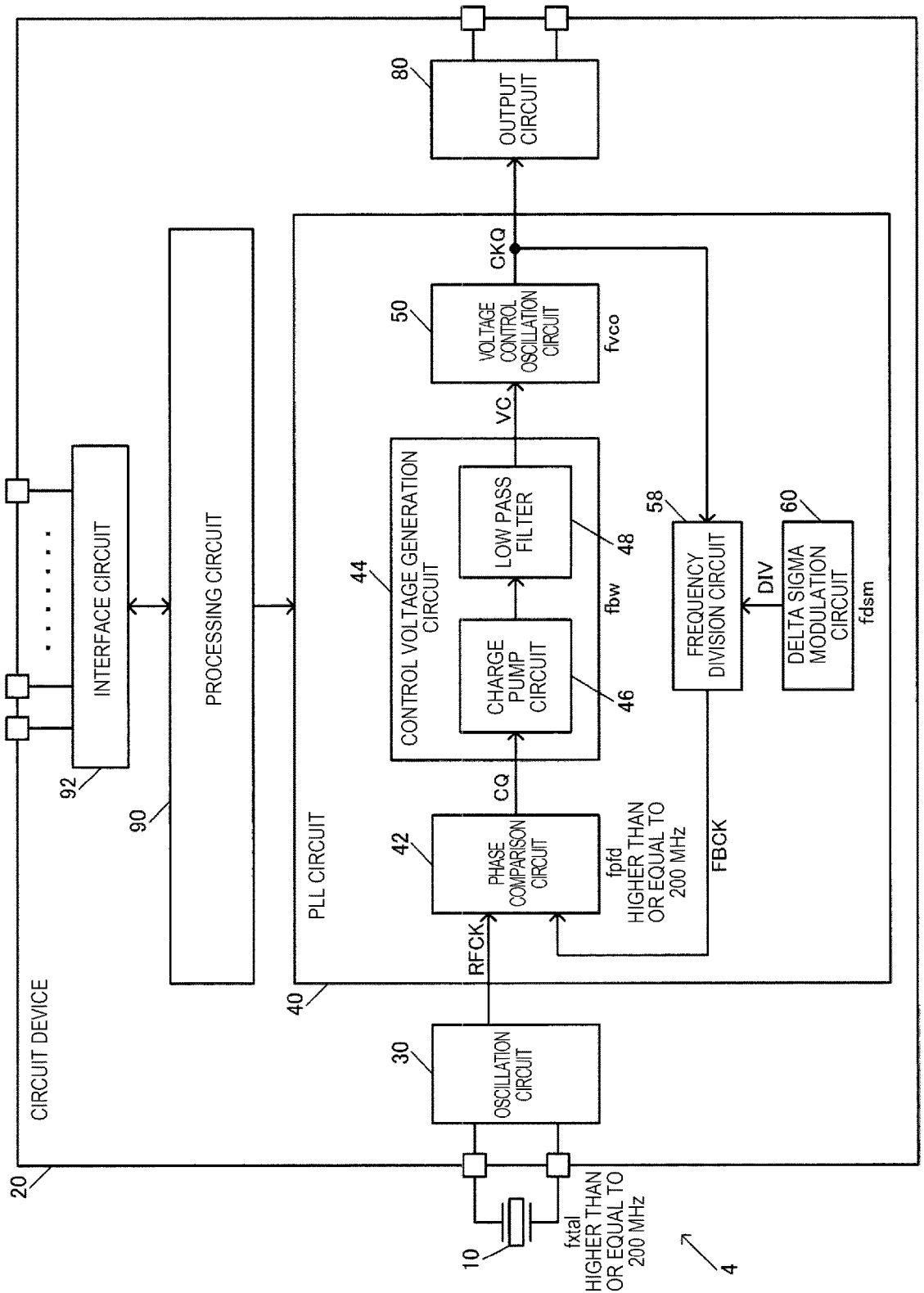
FIG. 2 illustrates a detailed configuration example of the oscillator according to the present embodiment.

FIG. 2 illustrates a detailed configuration example of the oscillator 4 according to the present embodiment. In FIG. 2, the circuit device 20 includes an output circuit 80, a processing circuit 90, and an interface circuit 92 in addition to the oscillation circuit 30 and the PLL circuit 40. The PLL circuit 40 further includes a delta sigma modulation circuit 60 in addition to the phase comparison circuit 42, the control voltage generation circuit 44, the voltage control oscillation circuit 50, and the frequency division circuit 58. That is, the PLL circuit 40 is a so-called fractional-N type PLL circuit. The delta sigma modulation circuit 60 receives the frequency division ratio data, performs a delta sigma modulation based on the frequency division ratio data, and sets the frequency division ratio of the frequency division circuit 58. The frequency division ratio data is set by, for example, the processing circuit 90. The frequency division ratio data is data for determining the frequency of the clock signal CKQ. For example, the frequency division ratio data is data for setting the frequency division ratio of the PLL circuit 40. The oscillator 4 is not limited to the configuration illustrated in FIG. 2, and various modifications such as omitting some of the configuration elements or adding other configuration element may be made.

The phase comparison circuit 42 of the PLL circuit 40 compares the phases of the reference clock signal RFCK and the feedback clock signal FBCK and outputs the signal CQ according to a phase difference. The control voltage generation circuit 44 generates the control voltage VC based on the signal CQ according to the phase difference. Specifically, the control voltage generation circuit 44 includes a charge pump circuit 46 and a low pass filter 48. For example, the phase comparison circuit 42 outputs an up signal or a down signal, which is the phase comparison result, as the signal CQ. The charge pump circuit 46 converts the signal CQ, which is the up signal or the down signal from the phase comparison circuit 42, into an output current. That is, the phase comparison circuit converts the up signal and down signal which are rectangular voltage pulses into the output current which is a rectangular current pulse. For example, the charge pump circuit 46 outputs a positive current pulse when the up signal is input, and outputs a negative current pulse when the down signal is input. The low pass filter 48 smooths an output signal of the charge pump circuit 46, generates the control voltage VC for controlling the oscillation frequency of the voltage control oscillation circuit 50, and outputs the control voltage VC to the voltage control oscillation circuit 50. Specifically, the low pass filter 48 performs a current voltage conversion of an output current of the charge pump circuit 46 and performs filter processing of the output current. The control voltage VC, which is an output voltage of the low pass filter 48, rises when the up signal is output and falls when the down signal is output. The low pass filter 48 can be realized by, for example, a third order or a fourth order RC filter. That is, the low pass filter can be realized by a passive RC filter using a resistor and a capacitor. The low pass filter 48 may be a passive filter using an inductor as a passive element.

By inputting the control voltage VC from the low pass filter 48 to the voltage control oscillation circuit 50, capacitance of a variable capacitance element realized by a varactor or the like changes, and an oscillation frequency of the voltage control oscillation circuit 50 is controlled. The clock signal CKQ of the frequency FVCO set by the control voltage VC is output to the frequency division circuit 58 and the output circuit 80.

In the present embodiment, the frequency division circuit 58 and the delta sigma modulation circuit 60 configure a fractional frequency divider. The fractional frequency divider divides a frequency of the clock signal CKQ by using a reciprocal number of a multiplication rate of the PLL circuit 40 as a frequency division ratio, and outputs a clock signal whose frequency is divided to the phase comparison circuit 42 as the feedback clock signal FBCK. The delta sigma modulation circuit 60 performs a delta sigma modulation of a value of a fractional part of the frequency division ratio to generate a modulation value which is an integer. For example, the delta sigma modulation circuit 60 performs delta sigma modulation processing of a third order and a fourth order. A value of an integer part of the frequency division ratio and an addition value of the modulation value are set in the frequency division circuit 58 as s set value of the frequency division ratio. Thereby, the fractional-N type PLL circuit 40 is realized.

Specifically, the delta sigma modulation circuit 60 operates based on, for example, the feedback clock signal FBCK, performs the delta sigma modulation for integrating and quantizing a fractional frequency division ratio L/M, and generates a delta sigma modulation signal. The delta sigma modulation circuit 60 performs addition and subtraction processing of the delta sigma modulation signal and an integer frequency division ratio N, and the added and subtracted output signal is input to the frequency division circuit 58. In the output signal after the addition and subtraction, a plurality of integer frequency division ratios in a range close to the integer frequency division ratio N change in time series, and a time average value thereof coincides with N+L/M. N+L/M is set by the frequency division ratio data from the processing circuit 90. For example, as described above, the frequency of the clock signal CKQ is referred to as FVCO, and the phase comparison frequency that is the frequencies of the reference clock signal RFCK and the feedback clock signal FBCK is referred to as FPFD. In this case, in a normal state in which the phase of the reference clock signal RFCK is synchronized to the phase of the feedback clock signal FBCK, a relation equation of FVCO=(N+L/M)×FPFD is established. By using the fractional-N type PLL circuit 40 having such a configuration, it is possible to generate the clock signal CKQ in which the reference clock signal RFCK is multiplied by the frequency division ratio represented by N+L/M.

The output circuit 80 receives the clock signal CKQ from the PLL circuit 40. Then, the clock signal CKQ is output to the outside of the circuit device 20 in a signal format such as low voltage differential signaling (LVDS), a positive emitter coupled logic (PECL), a high speed current steering logic (HCSL), or a differential complementary MOS (CMOS). For example, the output circuit 80 may be a circuit capable of outputting the clock signal CKQ in all the signal formats of the LVDS, the PECL, the HCSL, and the CMOS. In this case, the output circuit 80 outputs the clock signal CKQ in the signal format set by the processing circuit 90.

The processing circuit 90 performs various control processing and setting processing of the circuit device 20. For example, the processing circuit 90 performs the control processing of each circuit block of the circuit device 20. The processing circuit 90 may also perform digital signal processing such as temperature compensation processing, aging correction processing, or digital filter processing. When the temperature compensation process is performed, for example, a temperature sensor is provided, and the processing circuit 90 performs the temperature compensation processing of compensating temperature characteristics of an oscillation frequency based on temperature detection information from the temperature sensor and outputs frequency control data for controlling the oscillation frequency. Specifically, the processing circuit 90 performs the temperature compensation processing for canceling or suppressing a fluctuation of the oscillation frequency due to a change in temperature, based on the temperature detection data which changes according to the temperature and data of a temperature compensation coefficient which is a coefficient of an approximation function. The processing circuit 90 can be realized by a circuit of an application specific integrated circuit (ASIC) by automatic disposition and wiring of a gate array and the like. Alternatively, the processing circuit 90 may be realized by a processor such as a digital signal processor (DSP) or a central processing unit (CPU).

The interface circuit 92 is a circuit that performs an interface such as an inter integrated circuit (I2C) or a serial peripheral interface (SPI). That is, the interface circuit 92 performs interface processing with an external device of the oscillator 4.

Also in the oscillator 4 of FIG. 2, the oscillation frequency FXTAL of the quartz crystal resonator 10 is higher than or equal to 200 MHz, and the phase comparison frequency FPFD of the phase comparison circuit 42 is higher than or equal to 200 MHz. Specifically, the quartz crystal resonator 10 is a vibrator that oscillates at an oscillation frequency of the fundamental wave mode of FXTAL=400 MHz by, for example, a structure illustrated in FIG. 21 which will be described below. The oscillation circuit 30 is a circuit capable of performing an oscillation operation of 400 MHz by a configuration illustrated in FIG. 10 which will be described below. The phase comparison circuit 42 is a circuit capable of performing a phase comparison operation at a frequency higher than or equal to 400 MHz, and the charge pump circuit 46 is also a circuit capable of performing a charge pump operation at a frequency higher than or equal to 400 MHz. Thereby, the phase comparison frequency FPFD=400 MHz is realized. The low pass filter 48 is, for example, a circuit of a third-order passive RC filter as illustrated in FIG. 11 which will be described below. The voltage control oscillation circuit 50 performs an oscillation operation of the VCO of FVCO=5850 MHz by adopting a circuit configuration of an LC oscillation circuit illustrated in FIG. 13 which will be described below. The frequency division ratio DIV of the frequency division circuit 58 performs a frequency division operation of 14.625 on average. Specifically, the frequency division ratio is changed in a range of 11 to 18 by the delta sigma modulation of the delta sigma modulation circuit 60. The delta sigma modulation circuit 60 operates at an operation frequency of 400 MHz and performs third-order delta sigma modulation processing. A loop bandwidth of the PLL circuit 40 is 2 MHz. The loop bandwidth is a frequency of an upper limit of a frequency range of the loop band and corresponds to a cutoff frequency of loop filter characteristics of the PLL circuit 40. The loop bandwidth of the PLL circuit 40 is determined by using circuit characteristics of the voltage control oscillation circuit 50, a multiplication factor of the PLL circuit 40, and the like as a factor, in addition to the cutoff frequency of the low pass filter 48.

In general, a specification range of an offset frequency of phase noise measurement is a measurement range less than or equal to 100 MHz. That is, most of phase noise measurement apparatuses can measure the offset frequency with respect to the carrier frequency only in the range of 0 to 100 MHz, and the offset frequency range, which is the measurement frequency range of phase jitter in a communication standard, is less than or equal to 100 MHz. For example, the offset frequency range of 10G GIGABIT ETHERNET is 1.875 MHz to 20 MHz, and the offset frequency range of FIBER CHANNEL is 0.637 MHz to 10 MHz. The offset frequency range of SONET/SDH is 12 KHz to 5 MHz, 12 KHz to 20 MHz, or 20 KHz to 80 MHz. In each of these communication standards, the measurement apparatus measures the phase jitter in each offset frequency range.

Figure 5:
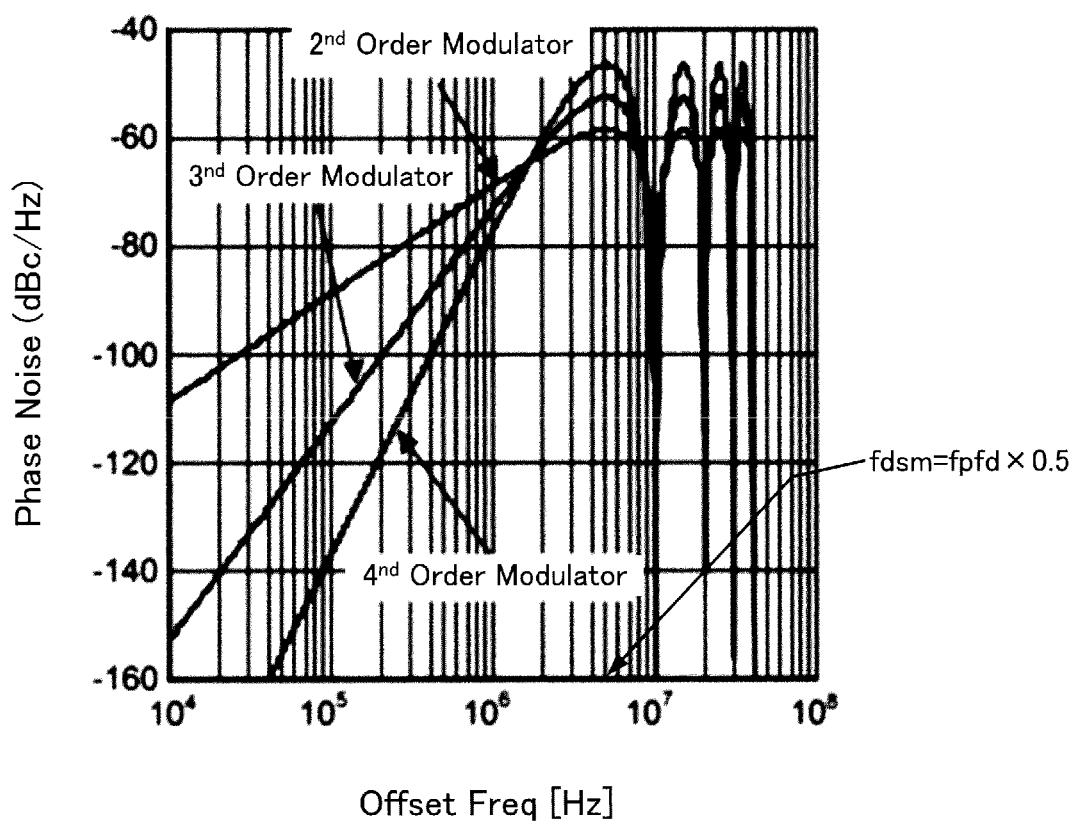
FIG. 5 is a diagram illustrating a relationship between a DSM noise and an order of a delta sigma modulation.

For example, in a case of the fractional-N type PLL circuit 40 of FIG. 2, a high resolution PLL operation is realized by using a delta sigma modulation, but the phase comparison frequency FPFD becomes an operating frequency of the delta sigma modulation circuit 60. Accordingly, as illustrated in FIG. 5 which will be described below, a DSM noise having a peak of a frequency of FREF×0.5, which is a half of the phase comparison frequency FPFD, is generated. In the PLL circuit 40 of FIGS. 1 and 2, components of the phase comparison frequency FPFD easily leak to an output of the PLL circuit 40 as a reference leak noise. A ratio of the frequency FVCO of VCO of the voltage control oscillation circuit 50 to a frequency of the reference clock signal RFCK=the phase comparison frequency FPFD is referred to as a multiplication number of the PLL circuit 40, but as the multiplication number=FVCO/FPFD increases, an in-band noise of the PLL circuit 40 increases.

A noise such as the above-described DSM noise, the reference leak noise, and the in-band noise is reduced as the phase comparison frequency FPFD is reduced and hinders noise reduction. Accordingly, in order to realize a low noise, it is desirable to operate the PLL circuit 40 with the phase comparison frequency FPFD as high as possible.

However, the general-purpose quartz crystal resonator 10 used to generate the reference clock signal RFCK of the PLL circuit 40 generally has an upper limit of oscillation at a frequency of approximately 50 MHz in the fundamental wave mode. Even in the third-order harmonic mode, an oscillation at a frequency of approximately 100 to 120 MHz is a limit. Thus, a noise is generated around the frequency of FPFD or FPFD/2, and the noise reduction of the PLL circuit 40 reaches a limit.

Therefore, in the present embodiment, the oscillation frequency FXTAL of the quartz crystal resonator 10 that generates the reference clock signal RFCK is set to be higher than or equal to 200 MHz. The PLL circuit 40 of FIG. 1 and FIG. 2 is operated by setting the phase comparison frequency FPFD to be higher than or equal to 200 MHz. When the oscillation circuit 30 is not provided with a doubler circuit and the like, FPFD=FXTAL is usually obtained. When the oscillation circuit 30 is provided with the doubler circuit and the like, for example, FPFD≥2×FXTAL. In a case of the fractional-N type PLL circuit 40 of FIG. 2, the operation frequency of the delta sigma modulation circuit 60 is also set to be higher than or equal to 200 MHz.

For example, in the present embodiment, the delta sigma modulation circuit 60 operates based on the feedback clock signal FBCK, and the phase comparison frequency FPFD becomes the operation frequency of the delta sigma modulation circuit 60. Thus, by increasing the phase comparison frequency FPFD to a frequency higher than or equal to 200 MHz, the DSM noise having a peak at a frequency of FDSM=FREF×0.5, which is a half of the phase comparison frequency FPFD, is driven to a frequency band higher than or equal to 100 MHz. As described above, the measurement range of the phase noise is a measurement range lower than 100 MHz. Thus, a frequency at which the DSM noise appears is out of the measurement range of the phase noise, and the specification and standard for the phase noise can be adhered to, and noise reduction can be realized. That is, it is considered that a high-frequency phase noise outside the measurement range can be sufficiently reduced by filter characteristics due to the loop band of the PLL circuit 40 and does not adversely affect the noise reduction even in an actual operation of the oscillator 4. In the present embodiment, the filter characteristics due to the loop band are appropriately described as loop filter characteristics. The loop filter characteristics are the frequency characteristics of the loop filter in the PLL loop.

Even if the components of the phase comparison frequency FPFD become a reference leak noise and leak to the output of the PLL circuit 40, by increasing the phase comparison frequency FPFD to the frequency higher than or equal to 200 MHz, the reference leak noise also becomes out of the measurement range of the phase noise, and the specification and standard for the phase noise can be adhered to. For example, since the reference leak noise can also be sufficiently reduced by the loop filter characteristics of the PLL circuit 40 and also becomes a noise that does not cause a problem even in the actual operation of the oscillator 4, noise reduction can be realized.

By increasing the phase comparison frequency FPFD to a frequency higher than or equal to 200 MHz, FVCO/FPFD which is a multiplication number of the PLL circuit 40 is reduced. For example, if the multiplication number increases, the in-band noise of the PLL circuit 40 increases, but if the multiplication number FVCO/FPFD is reduced by increasing the phase comparison frequency FPFD to the frequency higher than or equal to 200 MHz, the in-band noise of the PLL circuit 40 is reduced, and noise reduction of the PLL circuit 40 can be realized.

By increasing the phase comparison frequency FPFD to the frequency higher than or equal to 200 MHz, it is possible to sufficiently increase the frequency (FPFD) at which a reference leak noise that has to be removed originally in the PLL circuit 40 appears and the frequency (0.5×FPFD) at which the DSM noise appears. Thereby, a cutoff frequency of the low pass filter 48 that determines a loop bandwidth of the PLL circuit 40 can be set to a high frequency. Since the cutoff frequency of the low pass filter 48 can be set to a high frequency as such, it is possible to reduce a capacitance value of a capacitor or a resistance value of a resistor of the low pass filter 48 that determines the cutoff frequency of the low pass filter 48. Then, by reducing the capacitance value or the resistance value, a layout area of the capacitor or the resistor of the low pass filter 48 can be reduced, and an area reduction of the circuit device 20 can be realized.

Figures 3, 4:
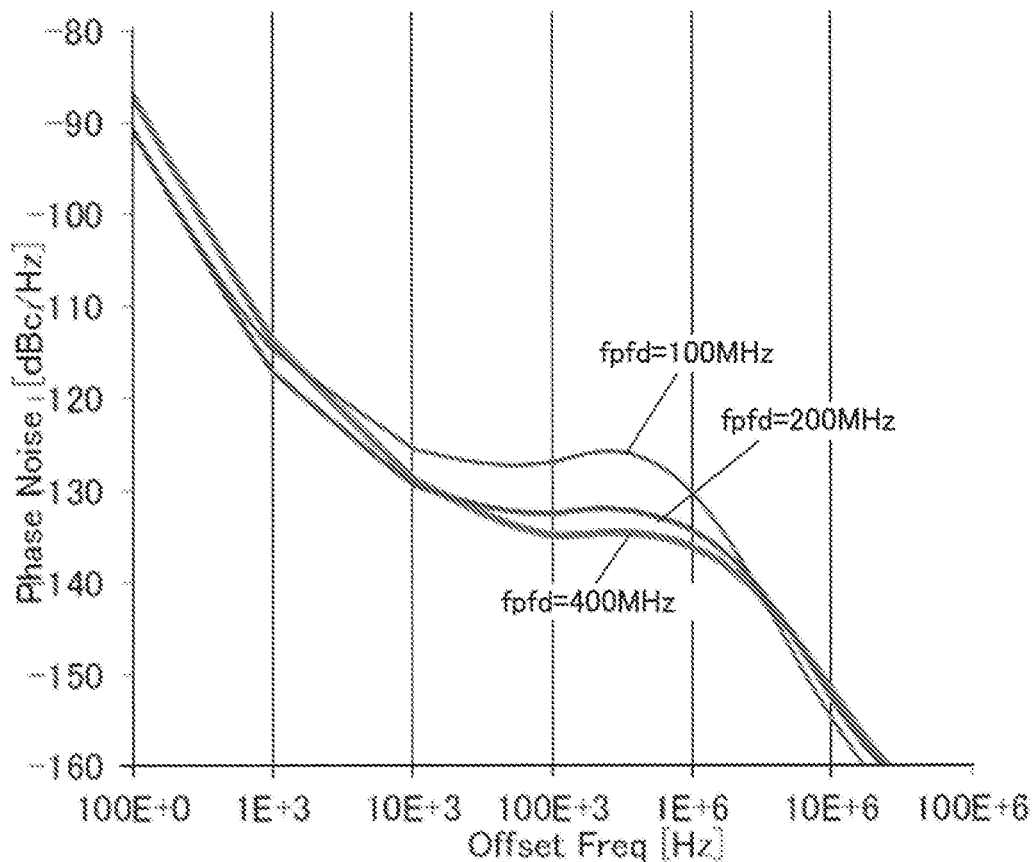
FIG. 3 is a diagram illustrating comparison of respective constants of a PLL circuit.
FIG. 4 is a diagram illustrating a relationship between a phase comparison frequency and a noise in a loop band of the PLL circuit.

FIG. 3 is a diagram illustrating comparison of respective constants of the PLL circuit. Here, a doubler circuit is not used for the oscillation circuit 30, and the phase comparison frequency FPFD and the oscillation frequency FXTAL are FPFD=FX.

In a case of FPFD=FXTAL=100 MHz, if the oscillation frequency FVCO of the voltage control oscillation circuit 50 is set to 5850 MHz, an average of the frequency division ratio DIV of the frequency division circuit 58 is 58.5. For example, a relation equation of DIV=NN=FVCO/FPFD is established. Here, NN represents a multiplication number. Since the phase comparison frequency is FPFD=100 MHz, a reference leak noise frequency is FLEAK=FPFD=100 MHz, and a DSM noise frequency is FDSM=FPFD×0.5=50 MHz. If a loop bandwidth FBW of the PLL circuit 40 is FBW=FPFD/200, FBW=0.5 MHz.

In a case of FPFD=FXTAL=200 MHz, if the frequency FVCO is set to 5850 MHz, an average of the frequency division ratio DIV is 29.25. Since the phase comparison frequency is FPFD=200 MHz, the reference leak noise frequency becomes FLEAK=FPFD=200 MHz, and the DSM noise frequency becomes FDSM=FPFD×0.5=100 MHz. A loop bandwidth of the PLL circuit 40 becomes FBW=FPFD/200=1.0 MHz.

In a case of FPFD=FXTAL=400 MHz, if the frequency FVCO is set to 5850 MHz, the average of the frequency division ratio DIV becomes 14.625. Since the phase comparison frequency is FPFD=400 MHz, the reference leak noise frequency becomes FLEAK=FPFD=400 MHz, and the DSM noise frequency becomes FDSM=FPFD×0.5=200 MHz. The loop bandwidth of the PLL circuit 40 becomes FBW=FPFD/200=2.0 MHz.

In FIG. 3, in a case of FPFD=200 MHz, a multiplication factor NN corresponding to the frequency division ratio DIV is reduced from 58.5 to 29.25 as compared with a case of FPFD=100 MHz. By reducing the multiplication factor NN as such, the in-band noise of the PLL circuit 40 is reduced as described above and noise reduction can be realized. If FPFD=400 MHz, the multiplication factor NN is further reduced to 14.625, and thereby, the in-band noise of the PLL circuit 40 can be reduced and noise can be further reduced.

In a case of FPFD=200 MHz, the reference leak noise frequency FLEAK is increased from 100 MHz to 200 MHz, and the DSM noise frequency is also increased from 50 MHz to 100 MHz as compared with a case of FPFD=100 MHz. By increasing FLEAK and FDSM to a frequency higher than or equal to 100 MHz as such, the reference leak noise and the DSM noise are out of the measurement range of the phase noise and can be sufficiently reduced by the loop filter characteristics of the PLL circuit 40, and thereby, noise reduction can be realized. If FPFD=400 MHz, FLEAK and FDSM become higher frequencies such that the reference leak noise frequency becomes 400 MHz and the DSM noise frequency becomes 200 MHz. Thus, the reference leak noise and the DSM noise can be further reduced by the loop filter characteristics of the PLL circuit 40, and thus, noise is further reduced.

In a case of FPFD=200 MHz, the loop bandwidth FBW of the PLL circuit 40 can be increased from 0.5 MHz to 1.0 MHz as compared with a case of FPFD=100 MHz. If the loop bandwidth FBW of the PLL circuit 40 increases, the cutoff frequency of the low pass filter 48 of the PLL circuit 40 can be set to a high frequency, and a capacitance value of the capacitor or a resistance value of the resistor of the low pass filter 48 that determines the cutoff frequency of the low pass filter 48 can be reduced. Thereby, it is possible to reduce a layout area of the capacitor or the resistor of the low pass filter 48 and to realize an area reduction of the circuit device 20 can be realized. If FPFD=400 MHz, the loop bandwidth FBW of the PLL circuit 40 can be increased to 2.0 MHz. Thus, it is possible to set the cutoff frequency of the low pass filter 48 to a higher frequency, and to further reduce the capacitance value of the capacitor or the resistance value of the resistor of the low pass filter 48. Thereby, it is possible to further reduce the area of the circuit device 20.

The in-band noise of the PLL circuit 40 can be represented by a theoretical equation such as following equation (1).

$$L_{IN\text{-}BAND}(F_M) = L(F_M) + 20 \times LOG_{10} FVCO - 10 \times LOG_{10} FREF \quad (1)$$

In equation (1), $L_{IN\text{-}BAND}$ ($F_M$) is the in-band noise, and FVCO is the oscillation frequency of the voltage control oscillation circuit 50 which is a VCO. FREF is the frequency of the reference clock signal RFCK, and FREF=FPFD. As is clear from equation (1), if the multiplication factor NN is ¼ times and FREF is 4 times while the FVCO remains the same, a third term of the right side of equation (1) becomes $-10 \times LOG_{10}(4) = -6$ DBC/HZ. Thus, the in-band noise of the PLL circuit 40 is improved by approximately −6DBC/HZ. That is, in FIG. 3, by quadrupling the phase comparison frequency FPFD so as to be 400 MHz from 100 MHz and reducing the multiplication factor NN to a quarter so as to be 14.625 from 58.5, a noise in the loop band of the PLL circuit 40 is improved by approximately −6DBC/HZ. That is, as the multiplication factor NN is reduced by increasing the phase comparison frequency FPFD, the noise in the loop band can be improved.

FIG. 4 is a diagram illustrating a relationship between the phase comparison frequency FPFD and the noise in the loop band of the PLL circuit 40. A horizontal axis denotes an offset frequency, and a vertical axis denotes a phase noise which is a noise in the loop band lower than or equal to substantially 1 MHz in the PLL circuit 40. As illustrated in FIG. 4, when the phase comparison frequency FPFD is 200 MHz, the noise in the loop band of the PLL circuit 40 is reduced as compared with a case of 100 MHz and is significantly improved. If the phase comparison frequency FPFD is set to 400 MHz, the noise in the loop band is further reduced and improved.

FIG. 5 is a diagram illustrating a relationship between the DSM noise and the order of the delta sigma modulation. A horizontal axis denotes the offset frequency, and a vertical axis denotes the phase noise. As illustrated in FIG. 5, the DSM noise has a peak at a frequency of FDSM=FPFD×0.5. Thus, if the phase comparison frequency FPFD is set to be higher than or equal to 200 MHz, the DSM noise peak frequency FDSM=FPFD×0.5 becomes higher than or equal to 100 MHz, which is out of a phase noise measurement range, and can be sufficiently reduced by the loop filter characteristics of the PLL circuit 40. If the order of the delta sigma modulation increases as illustrated in FIG. 5, a noise shaping effect increases. Thus, by increasing the order of the delta sigma modulation in the delta sigma modulation circuit 60, the DSM noise can be sufficiently reduced by the loop filter characteristics of the PLL circuit 40. However, even if the order of the delta sigma modulation changes, the DSM noise peak frequency FDSM=FPFD×0.5 does not change. Thus, as the phase comparison frequency FPFD increases, the FDSM which is a peak frequency of the DSM noise also increases and is easily reduced by the loop filter characteristics of the PLL circuit 40, and as a result, noise reduction of the PLL circuit 40 can be realized.

In order to reduce the reference leak noise, it is desirable to set the loop bandwidth FBW of the PLL circuit 40 to approximately ¹⁄₁₀₀ or less of the phase comparison frequency FPFD. That is, FBW≤FPFD/100. However, if the loop bandwidth FBW of the PLL circuit 40 is reduced immoderately, there are also disadvantages such as stability of the PLL circuit 40 becoming worse and lock time becoming longer. Therefore, by increasing the phase comparison frequency FPFD, it is desirable to enter the reference leak noise frequency FLEAK into a high frequency band and to give a degree of freedom that a system of the PLL circuit 40 is stabilized even if the loop bandwidth FBW of the PLL circuit 40 is increased to some extent. By increasing the reference leak noise frequency FLEAK, the reference leak noise due to the loop filter characteristics of the PLL circuit 40 is easily reduced, and as a result, noise reduction of the PLL circuit 40 can be realized.

Figure 6:
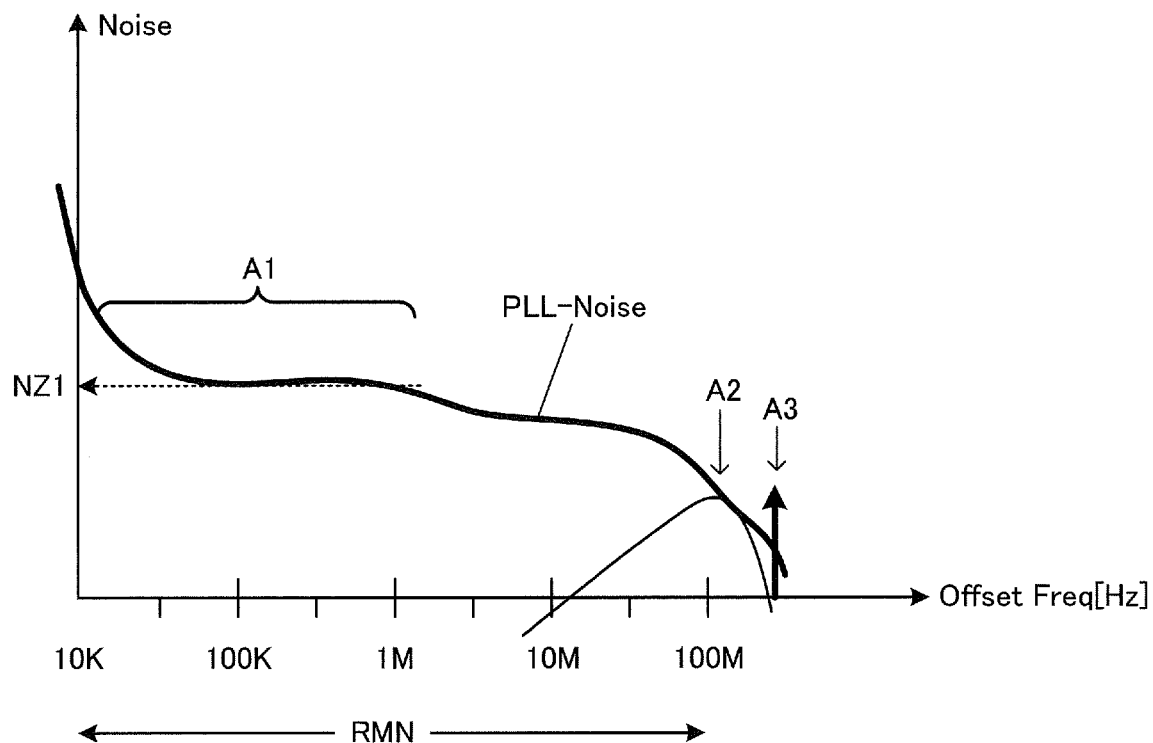
FIG. 6 is a diagram schematically illustrating noise characteristics when the phase comparison frequency is 400 MHz.
Figure 7:
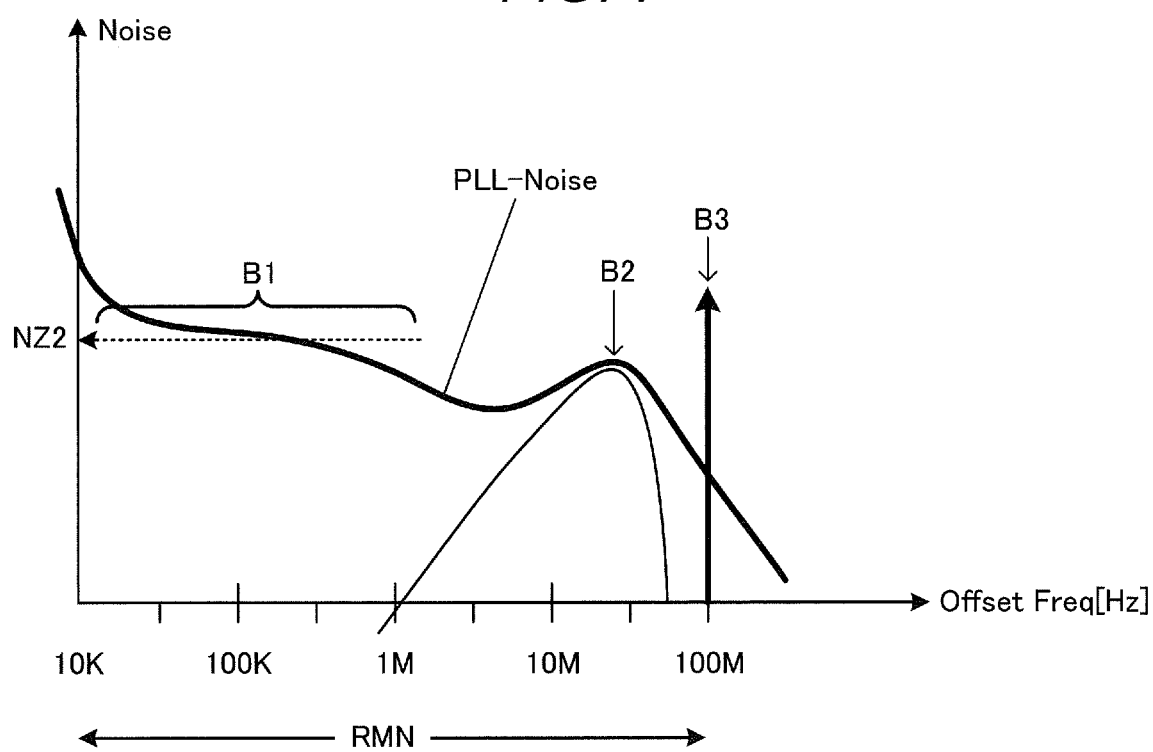
FIG. 7 is a diagram schematically illustrating noise characteristics when the phase comparison frequency is 100 MHz.

FIG. 6 is a diagram schematically illustrating noise characteristics of the PLL circuit 40 when the phase comparison frequency FPFD is 400 MHz, and FIG. 7 is a diagram schematically illustrating the noise characteristics when the phase comparison frequency FPFD is 100 MHz. In FIG. 6 and FIG. 7, horizontal axes are offset frequencies and denoted by a log scale. Vertical axes are phase noises. RMN is a phase noise measurement range, and a phase noise measurement range RMN is less than or equal to 100 MHz.

In FIG. 6 in which the phase comparison frequency is 400 MHz, a noise amount NZ1 in the loop band of the PLL circuit 40 illustrated in A1 is smaller than a noise amount NZ2 in the loop band illustrated in B1 of FIG. 7 in which the phase comparison frequency is 100 MHz. Specifically, the noise amount is reduced by substantially 6 DBC/HZ. That is, as described in FIG. 3 and equation (1), by setting FPFD=400 MHz, the multiplication number of the PLL circuit 40 is ¼ times as compared with a case of FPFD=100 MHz, and thereby, the in-band noise of the PLL circuit 40 can be reduced by substantially 6 DBC/HZ.

In FIG. 6 in which the phase comparison frequency FPFD is 400 MHz, the DSM noise peak frequency FDSM is substantially 200 MHz as illustrated in A2, and is out of the phase noise measurement range RMN with an upper limit of 100 MHz, and is sufficiently reduced by the loop filter characteristics of the PLL circuit 40. Meanwhile, in FIG. 7 in which the phase comparison frequency FPFD is 100 MHz, as indicated by B2, FDSM which is the DSM noise peak frequency is within the phase noise measurement range RMN, and becomes a noise that cannot be reduced sufficiently in the loop filter characteristics of the PLL circuit 40.

In FIG. 6 in which the phase comparison frequency FPFD is 400 MHz, the reference leak noise frequency FLEAK is substantially 400 MHz as indicated by A3, is out of the phase noise measurement range RMN, and is reduced sufficiently by the loop filter characteristics of the PLL circuit 40. Meanwhile, in FIG. 7 where the phase comparison frequency FPFD is 100 MHz, as indicated by B3, the reference leak noise frequency FLEAK is within the phase noise measurement range RMN and becomes a noise that cannot be reduced sufficiently in the loop filter characteristics of the PLL circuit 40.

2. Detailed Configuration Example

Figure 8:
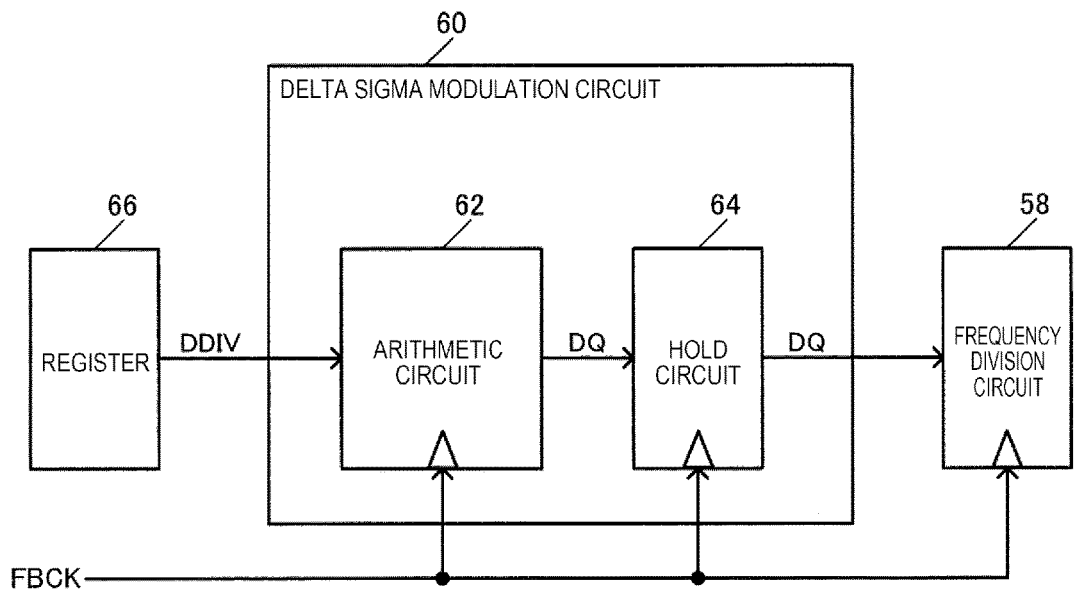
FIG. 8 illustrates a configuration example of a delta sigma modulation circuit.

FIG. 8 illustrates a detailed configuration example of the delta sigma modulation circuit 60. The delta sigma modulation circuit 60 receives frequency division ratio data DDIV for setting the frequency division ratio DIV, performs a delta sigma modulation based on the frequency division ratio data DDIV, and sets a frequency division ratio of the frequency division circuit 58. By providing the delta sigma modulation circuit 60, the fractional-N type PLL circuit 40 can be realized, and not only an integer but also a fraction can be set as the frequency division ratio DIV. In the present embodiment, even when the delta sigma modulation is performed by the delta sigma modulation circuit 60, the phase comparison frequency FPFD is set to be higher than or equal to 200 MHz, and thus, an adverse effect due to the DSM noise is reduced and noise reduction can be realized.

As illustrated in FIG. 8, since the delta sigma modulation circuit 60 operates based on a feedback clock signal FBCK having the same frequency as the phase comparison frequency FPFD, an operation frequency of the delta sigma modulation circuit 60 becomes the same frequency as the phase comparison frequency FPFD. Thus, by setting the phase comparison frequency FPFD to be higher than or equal to 200 MHz, the operation frequency of the delta sigma modulation circuit 60 also becomes higher than or equal to 200 MHz so as to be the same frequency as the phase comparison frequency FPFD. As such, when the operation frequency of the delta sigma modulation circuit 60 is higher than or equal to 200 MHz, the DSM noise peak frequency FDSM=FPFD×0.5 is higher than or equal to 100 MHz. Thus, the DSM noise peak frequency FDSM can be out of the phase noise measurement range, and noise reduction can be realized.

As illustrated in FIG. 8, the delta sigma modulation circuit 60 includes an arithmetic circuit 62 which performs an operation of a delta sigma modulation, and a hold circuit 64 which holds an operation result DQ of the arithmetic circuit 62. The arithmetic circuit 62 is realized by a product-sum calculator and the like and performs product-sum arithmetic processing and the like for the delta sigma modulation. For example, the frequency division ratio data DDIV is set to the register 66 by the processing circuit 90 illustrated in FIG. 2. The arithmetic circuit 62 performs arithmetic processing of the delta sigma modulation based on the frequency division ratio data DDIV. That is, the arithmetic circuit 62 operates by using the feedback clock signal FBCK as an operation clock signal and performs the arithmetic processing of the delta sigma modulation. The hold circuit 64 is realized by a circuit of first in first out (FIFO) configured by, for example, a flip flop circuit and the like, and takes in and holds an operation result DQ from the arithmetic circuit 62 at timing synchronized with the feedback clock signal FBCK. It is desirable that the hold circuit 64 is a circuit of a multistage FIFO configuration.

Figure 9:
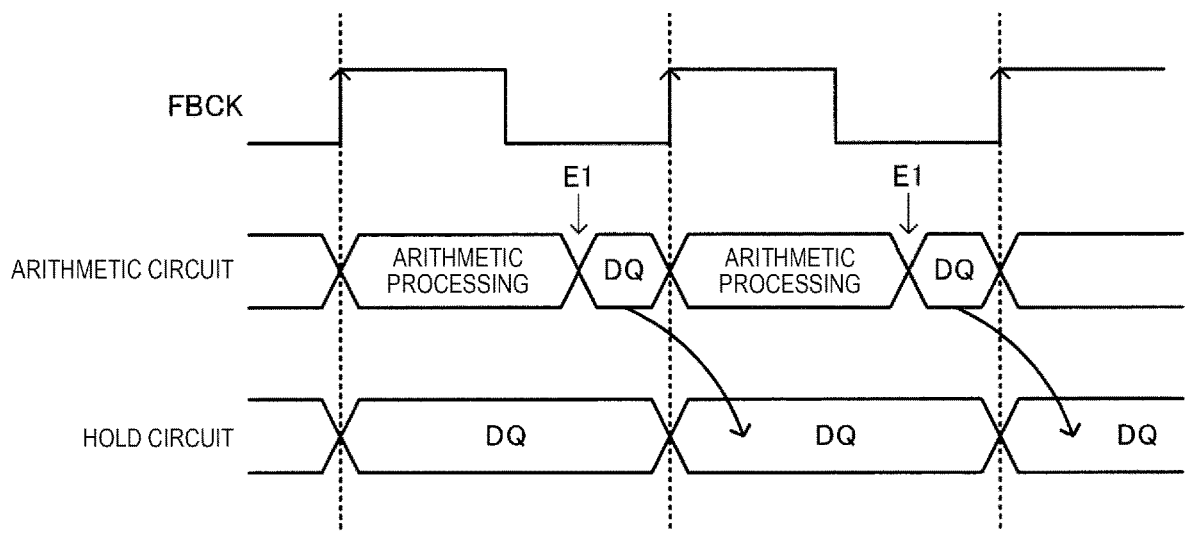
FIG. 9 is a signal waveform diagram illustrating an operation of the delta sigma modulation circuit.

In the present embodiment, the arithmetic circuit 62 outputs the operation result DQ in synchronization with the feedback clock signal FBCK, and the hold circuit 64 holds the operation result DQ in synchronization with the feedback clock signal FBCK and outputs the operation result DQ to the frequency division circuit 58. For example, FIG. 9 is a signal waveform diagram illustrating an operation of the delta sigma modulation circuit 60. As illustrated in FIG. 9, the arithmetic circuit 62 performs arithmetic processing of a delta sigma modulation in synchronization with the feedback clock signal FBCK. The hold circuit 64 takes in and holds the operation result DQ obtained by the arithmetic processing of the arithmetic circuit 62 in synchronization with the feedback clock signal FBCK. The held calculation result DQ is output to the frequency division circuit 58, and the frequency division circuit 58 takes in a frequency division ratio which is the operation result DQ from the hold circuit 64 by using, for example, the feedback clock signal FBCK. As such, in the present embodiment, the hold circuit 64 serving as a FIFO buffer circuit is provided between the arithmetic circuit 62 and the frequency division circuit 58. Thereby, even when the phase comparison frequency FPFD becomes a high frequency such as a frequency higher than or equal to 200 MHz and the operation frequency of the delta sigma modulation circuit 60 also becomes a high frequency such as a frequency higher than or equal to 200 MHz, appropriate calculation processing of the delta sigma modulation can be performed. That is, as illustrated in FIG. 9, the arithmetic circuit 62 can use time up to timing indicated by E1 in the second half of one clock cycle period of the feedback clock signal FBCK as time of the arithmetic processing. Thus, even when the operation frequency of the delta sigma modulation circuit 60 is as fast as the frequency higher than or equal to 200 MHz, the arithmetic processing of the delta sigma modulation is properly ended within one clock cycle, and thereby, the operation result DQ can be properly applied to the hold circuit 64.

Figure 10:
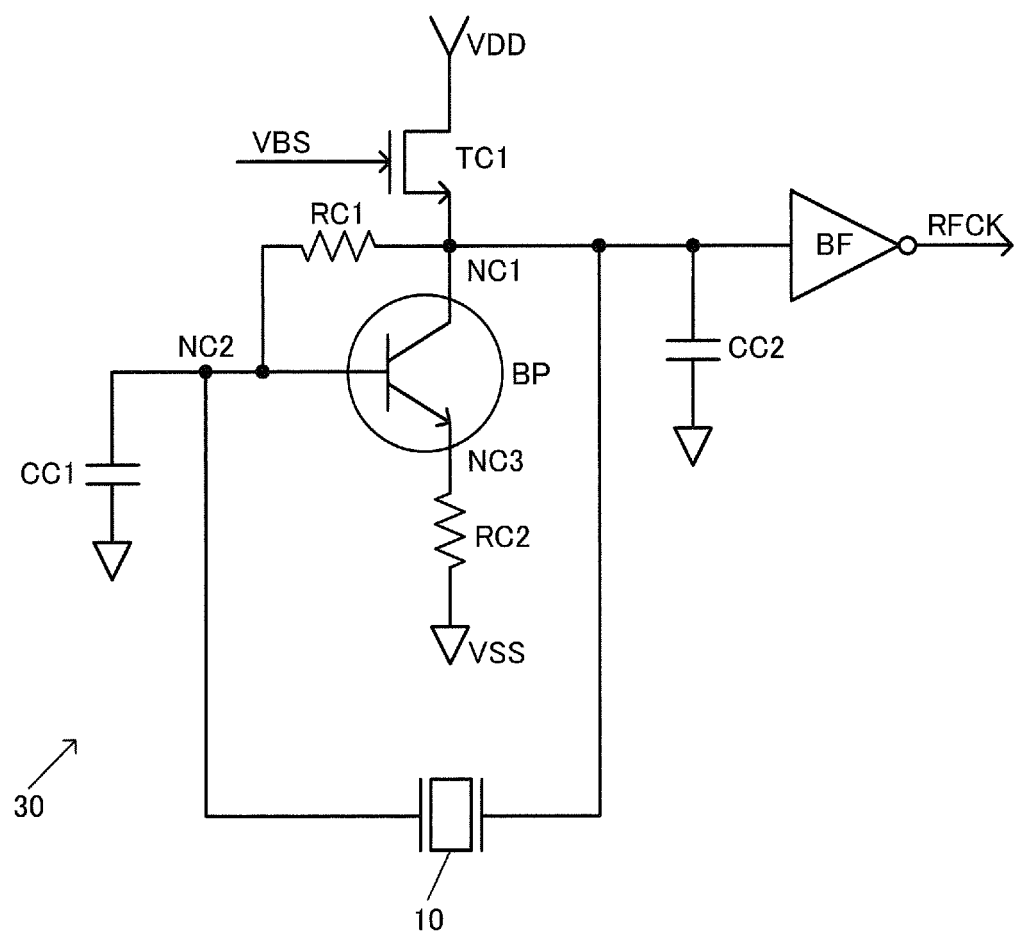
FIG. 10 illustrates a configuration example of an oscillation circuit.
Figure 11:
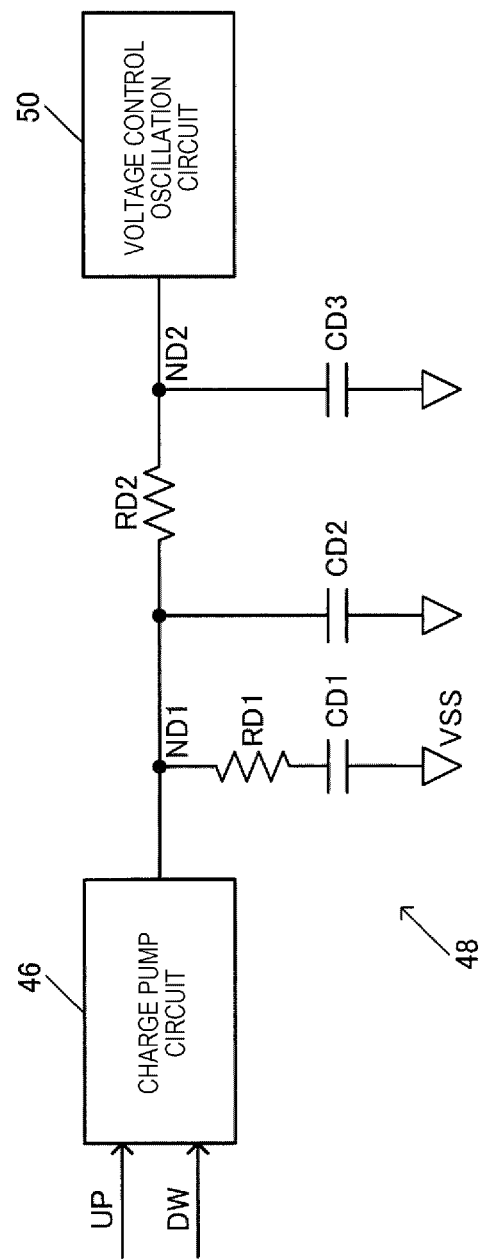
FIG. 11 illustrates a configuration example of a low pass filter.

FIG. 10 illustrates a detailed configuration example of the oscillation circuit 30. The oscillation circuit 30 of FIG. 10 is a Pierce-type oscillation circuit and includes a transistor TC1, a bipolar transistor BP, resistors RC1 and RC2, capacitors CC1 and CC2, and a buffer circuit BF. The N-type MOS transistor TC1, the bipolar transistor BP, and the resistor RC2 are coupled in series between a node of VDD which is a high potential side power supply and a node of VSS which is a low potential side power supply. Specifically, the transistor TC1 is provided between the node of VDD and a node NC1 of a collector of the bipolar transistor BP. A bias voltage VBS is input to a gate of the transistor TC1, and an oscillation current is set by the bias voltage VBS. The resistor RC1 is a feedback resistor for oscillation and is provided between the node NC1 and a node NC2 of a base of the bipolar transistor BP. The resistor RC2 is provided between a node NC3 of an emitter of the bipolar transistor BP and the node of VSS. The capacitors CC1 and CC2 are capacitances for oscillation, the capacitor CC1 is provided between the node NC2 and the node of VSS, and the capacitor CC2 is provided between the node NC1 and the node of VSS. The quartz crystal resonator 10 is coupled between the node NC1 and the node NC2. The buffer circuit BF has an input terminal coupled to the node NC1 and outputs the reference clock signal RFCK from an output terminal. The buffer circuit BF buffers an oscillation signal generated by the oscillation circuit 30 and outputs the buffered signal as the reference clock signal RFCK. Although the bipolar transistor BP is used in FIG. 10, a MOS transistor having characteristics of a high transition frequency FT may be used instead of the bipolar transistor BP. Coupling in the present embodiment is electrical coupling. The electrical coupling is coupling that enables an electrical signal to be transferred. The electrical coupling is coupling that enables information to be transferred by an electrical signal and may be made through a signal line, an active element, or the like.

According to the oscillation circuit 30 configured as illustrated in FIG. 10, even when a vibrator having the oscillation frequency FXTAL higher than or equal to 200 MHz is used as the quartz crystal resonator 10, it is possible to perform a high-speed oscillation operation higher than or equal to 200 MHz and to cause the quartz crystal resonator 10 to oscillate properly.

FIG. 11 illustrates a detailed configuration example of the low pass filter 48. The low pass filter 48 of FIG. 11 is a third-order passive RC filter and includes resistors RD1 and RD2 and capacitors CD1, CD2, and CD3. The resistor RD1 and the capacitor CD1 are provided in series between a node ND1 of an output terminal of a charge pump circuit 46 and the node of the VSS. The charge pump circuit 46 receives an up signal UP and a down signal DW from the phase comparison circuit 42 and performs a charge pump operation. The resistor RD2 is provided between the node ND1 and a node ND2 of an input terminal of the voltage control oscillation circuit 50. The capacitor CD2 is provided between the node ND1 and the node of VSS, and the capacitor CD3 is provided between the node ND2 and the node of VSS.

FIG. 12 illustrates an example of the phase comparison frequency, the loop bandwidth, and each constant of the low pass filter 48. FIG. 12 illustrates a numerical example of constants of the PLL circuit 40 when the phase comparison frequency FPFD is changed to 100 MHz, 200 MHz, and 400 MHz while keeping a phase margin, which is an index indicating stability of the PLL circuit 40, at 60 DEG or more. For example, in FIG. 12, the phase comparison frequency FPFD increases from 100 MHz to 200 MHz and from 200 MHz to 400 MHz, and the loop bandwidth FBW also increases from 0.5 MHz to 1.0 MHz and from 1.0 MHz to 2.0 MHz. Thereby, a capacitance value of the capacitor CD1 which occupies a large layout area in the low pass filter 48 can be reduced, for example, from 4000 PF to 2000 PF and from 2000 PF to 1000 PF. By thus reducing the capacitance value of the capacitor CD1, the layout area of the capacitor CD1 can be reduced, and area reduction of the circuit device 20 can be realized.

As such, in the present embodiment, the loop bandwidth FBW of the PLL circuit 40 becomes larger than 0.5 MHz. The loop band is, for example, an offset frequency at which a noise level becomes −3 DB from a flat region of the phase noise measurement result. Specifically, while the phase comparison frequency FPFD is higher than or equal to 200 MHz, the loop bandwidth FBW is larger than 0.5 MHz, and more preferably, the loop bandwidth FBW is larger than or equal to 1.0 MHz. By thus increasing the loop bandwidth FBW, a layout area of the capacitor or the resistor of the low pass filter 48 can be reduced, and the circuit device 20 can be reduced in area. The loop bandwidth FBW of the PLL circuit 40 can be set to, for example, a value in the range of FBW=FPFD/100 to FPFD/300.

Figure 13:
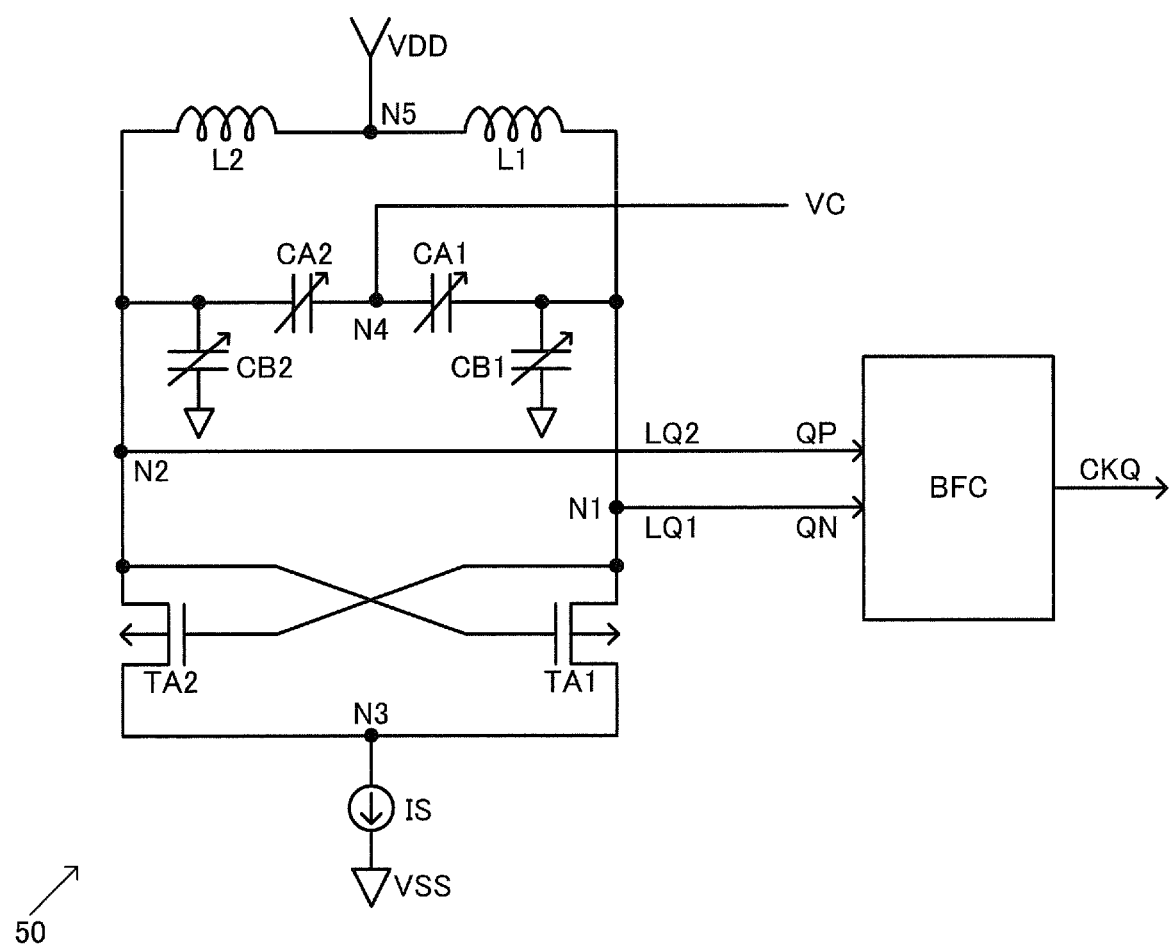
FIG. 13 illustrates a configuration example of a voltage control oscillator circuit.

FIG. 13 illustrates a detailed configuration example of the voltage control oscillation circuit 50. The voltage control oscillation circuit 50 according to the present embodiment is an LC oscillation circuit including inductors L1 and L2 and capacitors CA1 and CA2. That is, the voltage control oscillation circuit 50 is an LC oscillation circuit that performs an oscillation operation by using a resonance circuit including the inductors L1 and L2 and the capacitors CA1 and CA2. The inductors L1 and L2 of the LC oscillation circuit are formed by metal wiring layers of the circuit device 20. For example, the inductors L1 and L2 are formed by uppermost metal wiring layers among a plurality of the wiring layers of the circuit device 20. The metal wiring layer is, for example, an aluminum wiring layer. The uppermost metal wiring layer is an uppermost aluminum wiring layer called a top metal, and is, for example, a wiring layer that forms a pad of the circuit device 20. As such, if the LC oscillation circuit is used as the voltage control oscillation circuit 50, it is possible to realize an appropriate oscillation operation of the voltage control oscillation circuit 50 at a high oscillation frequency corresponding to a high phase comparison frequency. By forming the inductors L1 and L2 with the metal wiring layers of the circuit device 20, it is not necessary to use inductors of external parts, and the compact oscillator 4 can be obtained.

Specifically, the voltage control oscillation circuit 50 of FIG. 13 includes the inductors L1 and L2, capacitors CA1, CA2, CB1, and CB2, transistors TA1 and TA2, a current source IS, and a buffer circuit BFC. For example, the transistor TA1 is provided between a node N1 which is a coupling node of an output signal line LQ1 and a node N3, and the transistor TA2 is provided between a node N2 which is a coupling node of an output signal line LQ2 and the node N3. The current source IS is provided between the node N3 and the node of VSS. The transistors TA1 and TA2 are N-type transistors of, for example, a first conductive type. A gate of the transistor TA1 is coupled to the node N2, and a gate of the transistor TA2 is coupled to the node N1. The current source IS can be realized by, for example, an N-type transistor or the like in which a bias voltage is set to the gate.

In the voltage control oscillation circuit 50 of FIG. 13, the inductor L1 is provided between a node N5 of VVD and the node N1, and the inductor L2 is provided between the node N5 of VVD and the node N2. That is, one end of each of the inductors L1 and L2 is commonly coupled to the node N5 of VDD, and the other end of each of the inductors L1 and L2 is coupled to the nodes N1 and N2.

The control voltage VC for controlling the oscillation frequency of the voltage control oscillation circuit 50 is applied to a node N4 of the voltage control oscillation circuit 50. The control voltage VC is input from the control voltage generation circuit 44 to the voltage control oscillation circuit 50 as illustrated in FIGS. 1 and 2. The capacitor CA1 is provided between the node N4 and the node N1, and the capacitor CA2 is provided between the node N4 and the node N2. The capacitors CA1 and CA2 are capacitors with a variable capacitance and can be realized by, for example, varactors. The varactor is a capacitor whose capacitance is changed by an applied voltage and is also called a variable capacitance diode or a varicap. By applying the control voltage VC to one end of each of the capacitors CA1 and CA2 having a variable capacitance realized by the varactor or the like, a resonance frequency of the LC resonance circuit configured by the inductors L1 and L2 and the capacitors CA1 and CA2 changes, and thus, it is possible to control the oscillation frequency of the voltage control oscillation circuit 50.

In the voltage control oscillation circuit 50 of FIG. 13, the capacitor CB1 is provided between the node N1 and the node of VSS, and the capacitor CB2 is provided between the node N2 and the node of VSS. The capacitors CB1 and CB2 are capacitors with a variable capacitance and can be realized by, for example, a capacitor array of metal insulator metal (MIM) capacitors and a switch array of switch elements. For example, capacitances of the capacitors CB1 and CB2 can be variably adjusted by controlling on and off of the switch elements of the switch array based on frequency setting data. A fine adjustment of the frequency of the voltage control oscillation circuit 50 can be realized by changing the capacitances of the capacitors CB1 and CB2. For example, at the time of shipment or inspection of a product of the circuit device 20, the capacitances of the capacitors CB1 and CB2 can be adjusted, and thereby, the oscillation frequency of the voltage control oscillation circuit 50 can be adjusted within a specification range of a nominal frequency.

The buffer circuit BFC receives differential output signals QP and QN output to output signal lines LQ1 and LQ2 and outputs the clock signal CKQ of a single end. As illustrated in FIG. 2, the clock signal CKQ is output to the frequency division circuit 58 and the output circuit 80.

Figure 14:
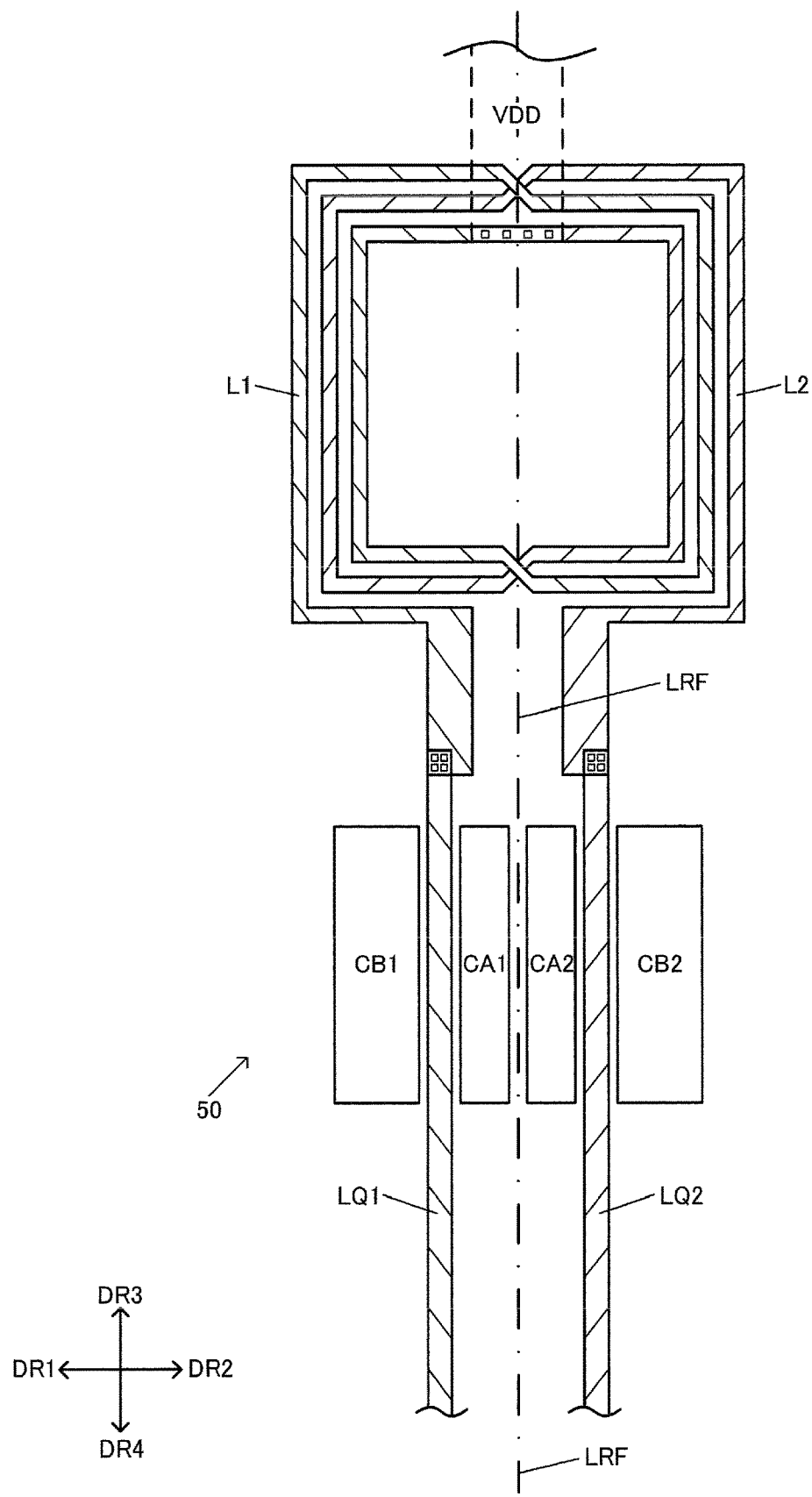
FIG. 14 illustrates a layout disposition example of an inductor and a capacitor of the voltage control oscillator circuit.

FIG. 14 illustrates a layout disposition example of the voltage control oscillation circuit 50. The layout disposition indicates a physical disposition of a circuit element and a circuit block in a semiconductor chip of the circuit device 20. In FIG. 14, an opposite direction of a direction DR1 is denoted as a direction DR2, a direction orthogonal to the direction DR1 is denoted as a direction DR3, and an opposite direction of a direction DR3 is denoted as a direction DR4. The directions DR1, DR2, DR3, and DR4 are a first direction, a second direction, a third direction, and a fourth direction, respectively.

In FIG. 14, the output signal lines LQ1 and LQ2 of the voltage control oscillation circuit 50 are wired in, for example, the direction DR3. For example, the output signal lines LQ1 and LQ2 are wired in parallel with each other. A reference line between the output signal lines LQ1 and LQ2 is referred to as LRF. The reference line LRF is a line in the direction DR3. The reference line LRF is, for example, a line corresponding to a symmetry axis in the layout disposition of the voltage control oscillation circuit 50. For example, the voltage control oscillation circuit 50 is disposed in line symmetry by using the reference line LRF as the symmetry axis. The layout disposition can prevent a balance of differential signal transmission from being worse.

The voltage control oscillation circuit 50 is an LC oscillation circuit including the inductors L1 and L2 and the capacitors CA1 and CA2 as illustrated in FIG. 13. The inductors L1 and L2 are formed by winding a metal wire such as an aluminum layer a plurality of times. For example, the inductor L1 is formed by winding the metal wire clockwise, and the inductor L2 is formed by winding the metal wire counterclockwise. For example, the metal wire of the inductor L1 and the metal wire of the inductor L2 are disposed to be wired in parallel. For example, in a region on the direction DR1 side with respect to the reference line LRF, the metal wire of the inductor L1 is wired on the outermost periphery, the metal wire of the inductor L2 is wired inside thereof, and the metal wire of the inductor L1 is wired inside thereof. Meanwhile, in a region on the direction DR2 side with respect to the reference line LRF, the metal wire of inductor L2 is wired on the outermost periphery, the metal wire of inductor L1 is wired inside thereof, and the metal wire of inductor L2 is wired inside thereof.

As illustrated in FIG. 13, the voltage control oscillation circuit 50 includes the capacitors CA1 and CB1 with a variable capacitance, each having one end coupled to the output signal line LQ1, and the capacitors CA2 and CB2 with a variable capacitance, each having one end coupled to the output signal line LQ2. As illustrated in FIG. 14, the capacitors CA1 and CB1 are disposed on the direction DR1 side with respect to the reference line LRF. Specifically, the capacitor CA1 is disposed between the reference line LRF and the output signal line LQ1, and the capacitor CB1 is disposed on the direction DR1 side of the output signal line LQ1. Meanwhile, the capacitors CA2 and CB2 are disposed on the direction DR2 side with respect to the reference line LRF. Specifically, the capacitor CA2 is disposed between the reference line LRF and the output signal line LQ2, and the capacitor CB2 is disposed on the direction DR2 side of the output signal line LQ2. Although the capacitors CB1 and CB2 for fine adjustment of the oscillation frequency are provided in FIG. 13 and FIG. 14, a modification, such as a configuration in which the capacitors CB1 and CB2 are not provided, may be made.

By providing the capacitors CA1, CB1, CA2, and CB2 having a variable capacitance as such, it is possible to perform a control, an initial adjustment, and the like of the oscillation frequency of the voltage control oscillation circuit 50. According to the capacitor disposition method illustrated in FIG. 14, the capacitors CA1, CB1, CA2, and CB2 can be coupled in a short path to the output signal lines LQ1 and LQ2 wired along the reference line LRF. Thereby, it is possible to improve a layout efficiency, to reduce an area of the circuit device 20, and to suppress occurrence of a situation and the like in which the oscillation frequency fluctuates due to a parasitic capacitance due to routing of a signal. It is possible to arrange the capacitors CA1 and CB1 and the capacitors CA2 and CB2 in line symmetry with respect to the reference line LRF, and to prevent a balance of differential signal transmission from being worse.

3. Structure of Oscillator

Next, various structure examples of the oscillator 4 according to the present embodiment will be described. As described with reference to FIGS. 13 and 14, the voltage control oscillation circuit 50 of the oscillator 4 according to the present embodiment is an LC oscillation circuit, and the inductors L1 and L2 of the LC oscillation circuit are formed by the metal wiring layers of the circuit device 20. Specifically, the inductors L1 and L2 are formed by the metal wiring layers in the uppermost layer of the semiconductor chip of the circuit device 20. As illustrated in FIG. 3, the voltage control oscillation circuit 50 needs to oscillate at a high frequency such as 5850 MHz. In order to properly oscillate the voltage control oscillation circuit 50 with a low noise, a disposition relationship between the inductors L1 and L2, the quartz crystal resonator 10, and the like becomes a problem. In the following, the inductors L1 and L2 will be collectively referred to as an inductor L.

Figure 15:
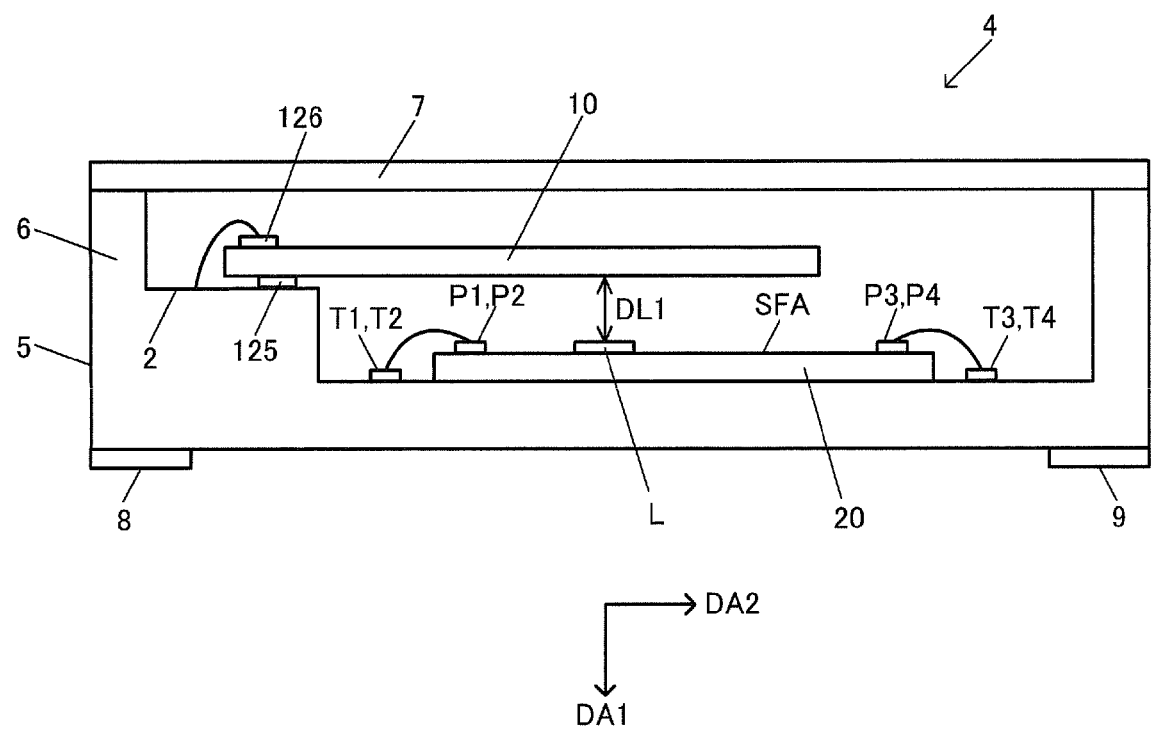
FIG. 15 is a sectional view of a first structure example of an oscillator.

FIG. 15 is a sectional view schematically illustrating a first structure example of the oscillator 4. The oscillator 4 includes a package 5 in which the quartz crystal resonator 10 and the circuit device 20 are housed. The package 5 is formed of, for example, a ceramic or the like and has a housing space in an inside thereof, and the circuit device 20 and the quartz crystal resonator 10 are housed in the housing space. The housing space is hermetically sealed and is preferably in a reduced pressure state which is a state close to vacuum. The package 5 can properly protect the quartz crystal resonator 10 and the circuit device 20 from impact, dust, heat, moisture, and the like. The package 5 has a base 6 and a lid 7. Specifically, the package 5 is configured with the base 6 supporting the quartz crystal resonator 10 and the circuit device 20, and the lid 7 bonded to an upper surface of the base 6 so as to form the housing space between the base 6 and the lid 7.

As illustrated in FIG. 15, the base 6 has a first recess portion opened on an upper surface and a second recess portion opened on a bottom surface of the first recess portion. A step difference portion 2 is provided on the bottom surface of the first recess portion, and the quartz crystal resonator 10 is supported by the step difference portion 2. Terminal electrodes 125 and 126 of the quartz crystal resonator 10 are electrically coupled to internal terminals T1 and T2 of the oscillator 4 through an internal wire and a bonding wire of the package 5. The terminal electrodes 125, 126 are also called pad electrodes. The internal terminals T1 and T2 are provided on a bottom surface of the second recess portion of the base 6. The internal terminals T1 and T2 are coupled to terminals P1 and P2 for vibrator coupling of the circuit device 20 through, for example, the bonding wires. The terminals P1 and P2 are pads of the circuit device 20 which is a semiconductor chip. Thereby, the terminal electrodes 125 and 126 of the quartz crystal resonator 10 and the terminals P1 and P2 of the circuit device 20 are electrically coupled to each other. That is, the quartz crystal resonator 10 of FIGS. 1 and 2 and the oscillation circuit 30 are electrically coupled to each other, and an oscillation operation of the quartz crystal resonator 10 can be performed by the oscillation circuit 30.

The internal terminals T3 and T4 of the oscillator 4 are coupled to terminals P3 and P4 for external coupling of the circuit device 20 through the bonding wires. The internal terminals T3 and T4 are provided on the bottom surface of the second recess portion of the base 6. The terminals P3 and P4 are pads of the circuit device 20. The internal terminals T3 and T4 of the oscillator 4 are electrically coupled to the external terminals 8 and 9 of the oscillator 4 through the internal wires of the package 5. The external terminals 8 and 9 are formed on an external bottom surface of the package 5. The external terminals 8 and 9 are coupled to an external device through external wires. The external wires are, for example, wires formed on a circuit substrate on which the external device is mounted. This enables electrical coupling between the circuit device 20 and the external device and allows exchange of information between the circuit device 20 and the external device through, for example, the interface circuit 92 illustrated in FIG. 2. Alternatively, supply or the like of power to the circuit device 20 is also possible. FIG. 15 illustrates that the number of terminals of each of the terminals P3 and P4 of the circuit device 20, the internal terminals T3 and T4 of the oscillator 4, and the external terminals 8 and 9 of the oscillator 4 is two for the sake of convenience, but the number of terminals is three or more in actual fact.

Figure 17:
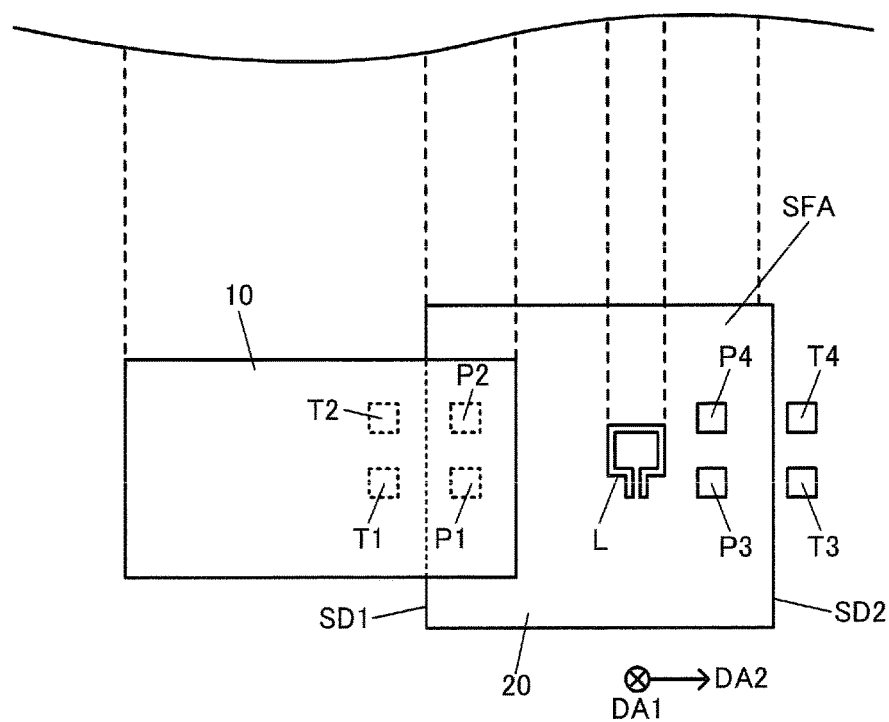
FIG. 17 is a plan diagram of the second structure example of the oscillator.

In FIG. 15, the inductor L is provided on an active surface SFA of the circuit device 20. The inductor L corresponds to the inductors L1 and L2 in FIGS. 13 and 14. For example, the circuit device 20 has a semiconductor substrate, and an active element such as a transistor is formed on the active surface SFA of the semiconductor substrate. Passive elements such as a resistor, a capacitor, and an inductor are also formed on the active surface SFA. The active surface SFA is a main surface of the semiconductor substrate of the circuit device 20. The semiconductor chip which is the circuit device 20 has, for example, a rectangular shape in a planar view in a direction DA1 orthogonal to the active surface SFA as illustrated in FIG. 17 which will be described below. The rectangular shape referred to here is not necessarily perfect, a part thereof includes a projection shape or a recess shape, and a side thereof is allowed to include a curved line. In FIG. 15, a direction orthogonal to the direction DA1 is referred to as a direction DA2. The direction DA2 is, for example, a direction along the active surface SFA of the circuit device 20.

In FIG. 15, the quartz crystal resonator 10 and the circuit device 20 are disposed in the package such that the active surface SFA of the circuit device 20 faces the quartz crystal resonator 10. For example, the quartz crystal resonator 10 and the circuit device 20 are disposed such that a first main surface, which is the active surface SFA, of the first main surface and a second main surface of the circuit device 20 faces a main surface of the quartz crystal resonator 10. Specifically, the quartz crystal resonator 10 is supported by the step difference portion 2 of the base 6 such that the active surface SFA of the circuit device 20 faces the quartz crystal resonator 10, and the circuit device 20 is disposed on the bottom surface of the second recess portion. In the present embodiment, a distance DL1 between the inductor L provided on the active surface SFA of the circuit device 20 and the quartz crystal resonator 10 is greater than or equal to 150 μm. For example, the inductor L is provided at a position facing an excitation electrode of the quartz crystal resonator 10 in the active surface SFA of the circuit device 20, and the distance DL1 between the inductor L and the excitation electrode of the quartz crystal resonator 10 is greater than or equal to 150 μm. The distance DL1 is a distance between the inductor L and the quartz crystal resonator 10 in the direction DA1 and is a minimum distance between the inductor L and the quartz crystal resonator 10.

As described above, in FIG. 15, the oscillator 4 includes the package 5 in which the quartz crystal resonator 10 and the circuit device 20 are housed, and the quartz crystal resonator 10 and the circuit device 20 are disposed in the package 5 such that the active surface SFA of the circuit device 20 faces the quartz crystal resonator 10. The inductor L is provided on the active surface SFA of the circuit device 20. The distance DL1 between the inductor L and the quartz crystal resonator 10 is greater than or equal to 150 μm. For example, if the distance DL1 between the inductor L and the quartz crystal resonator 10 is short, a magnetic field due to the inductor L is hindered by an electrode such as the excitation electrode of the quartz crystal resonator 10, and a situation occurs in which inductance of the inductor L fluctuates from a design value. If the inductance fluctuates in this way, an LC resonance frequency of the voltage control oscillation circuit 50, which is an LC oscillation circuit, fluctuates, an oscillation noise is generated, or in a worst case, a situation occurs in which an oscillation operation stops. In this respect, if the distance DL1 between the inductor L and the quartz crystal resonator 10 is increased to be greater than or equal to 150 μm, the magnetic field due to the inductor L is hindered by the electrode, and thereby, it is possible to suppress fluctuation of the inductance. Thereby, it is possible to suppress generation of an oscillation noise or to prevent a situation in which an oscillation operation stops from occurring.

Figure 16:
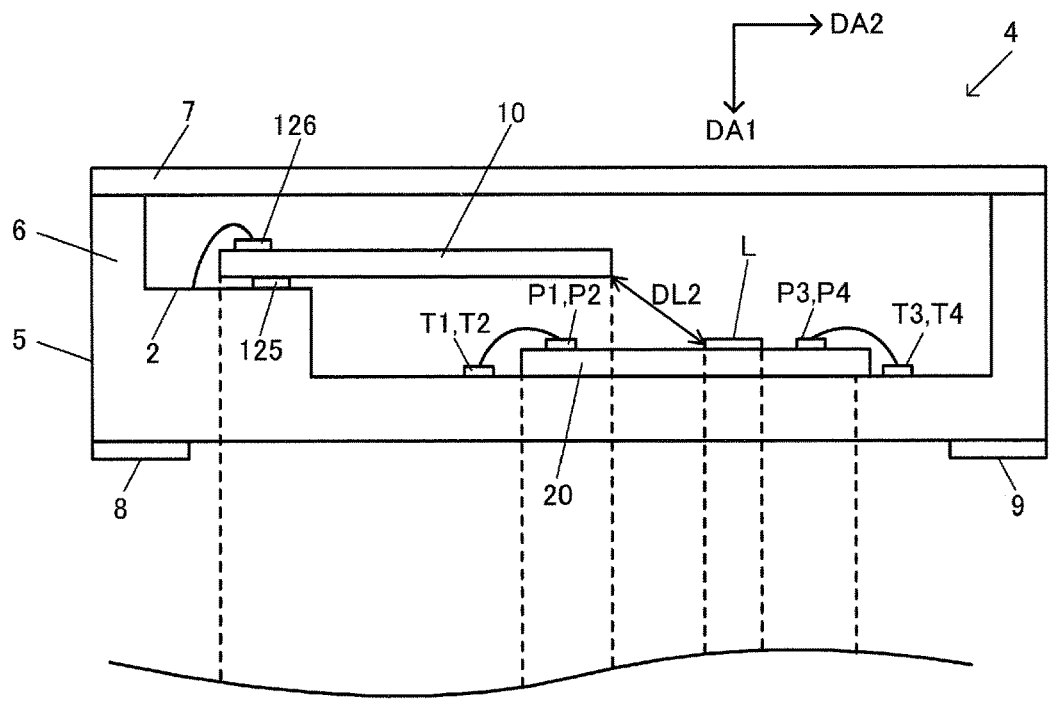
FIG. 16 is a sectional view of a second structure example of the oscillator.

FIG. 16 is a sectional view schematically illustrating a second structure example of the oscillator 4, and FIG. 17 is a plan diagram schematically illustrating the second structure example. A structure of the package 5 configured with the base 6 and the lid 7, coupling of the terminal electrodes 125 and 126 to the terminals P1 and P2 through the internal terminals T1 and T2, coupling of the terminals P3 and P4 to the external terminals 8 and 9 through the internal terminals T3 and T4, and the like are the same as in FIG. 15, and thus, detailed description thereon will be omitted.

The oscillator 4 of FIGS. 16 and 17 includes the package 5 in which the quartz crystal resonator 10 and the circuit device 20 are housed, the inductor L is provided on the active surface SFA of the circuit device 20, and the active surface SFA faces the quartz crystal resonator 10. Furthermore, in the second structure example of FIGS. 16 and 17, the quartz crystal resonator 10 and the circuit device 20 are disposed in the package 5 such that the inductor L and the quartz crystal resonator 10 do not overlap each other in plan view in the direction DA1 orthogonal to the active surface SFA.

For example, FIG. 17 is a plan diagram in plan view in a direction DA1 orthogonal to the active surface SFA. As illustrated in FIG. 17, the inductor L and the quartz crystal resonator 10 are disposed so as not to overlap in plan view in the direction DA1. For example, the quartz crystal resonator 10 and the circuit device 20 are disposed such that an electrode such as an excitation electrode of the quartz crystal resonator 10 is not located above the inductor L.

According to such a disposition, as is apparent from FIG. 16, the distance DL2 between the inductor L and the quartz crystal resonator 10 can be increased, and for example, the distance DL2 is easily set to be greater than or equal to 150 μm. The distance DL2 is, for example, a distance between an end portion of the inductor L and an end portion of the quartz crystal resonator 10, and is a minimum distance between the inductor L and the quartz crystal resonator 10. As such, if the inductor L and the quartz crystal resonator 10 are disposed so as not to overlap each other in plan view and the distance DL2 is increased, it is possible to suppress that the magnetic field of the inductor L is hindered by the electrode and the like of the quartz crystal resonator 10 and thereby the inductance fluctuates. Thereby, it is possible to suppress generation of an oscillation noise or to prevent a situation in which an oscillation operation stops from occurring.

In FIGS. 16 and 17, the circuit device 20 has a side SD1, and a side SD2 which is an opposite side of the side SD1. The side SD1 is a first side, and the side SD2 is a second side. That is, as illustrated in FIG. 17, the circuit device 20 has, for example, a rectangular shape in plan view in the direction DA1 orthogonal to the active surface SFA. The sides SD1 and SD2 are sides in the rectangular shape. In the plan view of FIG. 17, the side SD1 of the circuit device 20 is disposed at a position closer to the quartz crystal resonator 10 than the side SD2. For example, the quartz crystal resonator 10 is disposed on the side SD1 of the circuit device 20. The quartz crystal resonator 10 is disposed at a position closer to the side SD1 than the inductor L. For example, a distance between the quartz crystal resonator 10 and the side SD1 is shorter than a distance between the inductor L and the side SD1. That is, the quartz crystal resonator 10 is disposed at a position on the side SD1 side in plan view. Meanwhile, in the plan view of FIG. 17, the inductor L is disposed at a position closer to the side SD2 than the quartz crystal resonator 10. For example, a distance between the inductor L and the side SD2 is shorter than a distance between the quartz crystal resonator 10 and the side SD2. That is, the inductor L is disposed at a position on the side SD2 side in plan view. That is, in plan view in the direction DA1 orthogonal to the active surface SFA of the circuit device 20, the quartz crystal resonator 10 and the circuit device 20 are disposed in the package 5 such that the quartz crystal resonator 10 is disposed at a position closer to the side SD1 than the inductor L, and the inductor L is disposed at a position closer to the side SD2 than the quartz crystal resonator 10.

According to such a disposition, as is apparent from FIG. 16, the distance DL2 between the inductor L and the quartz crystal resonator 10 can be increased, and for example, the distance DL2 is easily set to be greater than or equal to 150 μm. As such, in plan view, if the quartz crystal resonator 10 is disposed on the side SD1 side, the inductor L is disposed on the side SD2 side, and the distance DL2 is increased, it is possible to suppress that a magnetic field due to the inductor L is hindered by an electrode and the like of the quartz crystal resonator 10 and thereby inductance fluctuates. Thereby, it is possible to suppress generation of an oscillation noise or to prevent a situation in which an oscillation operation stops from occurring.

Figure 18:
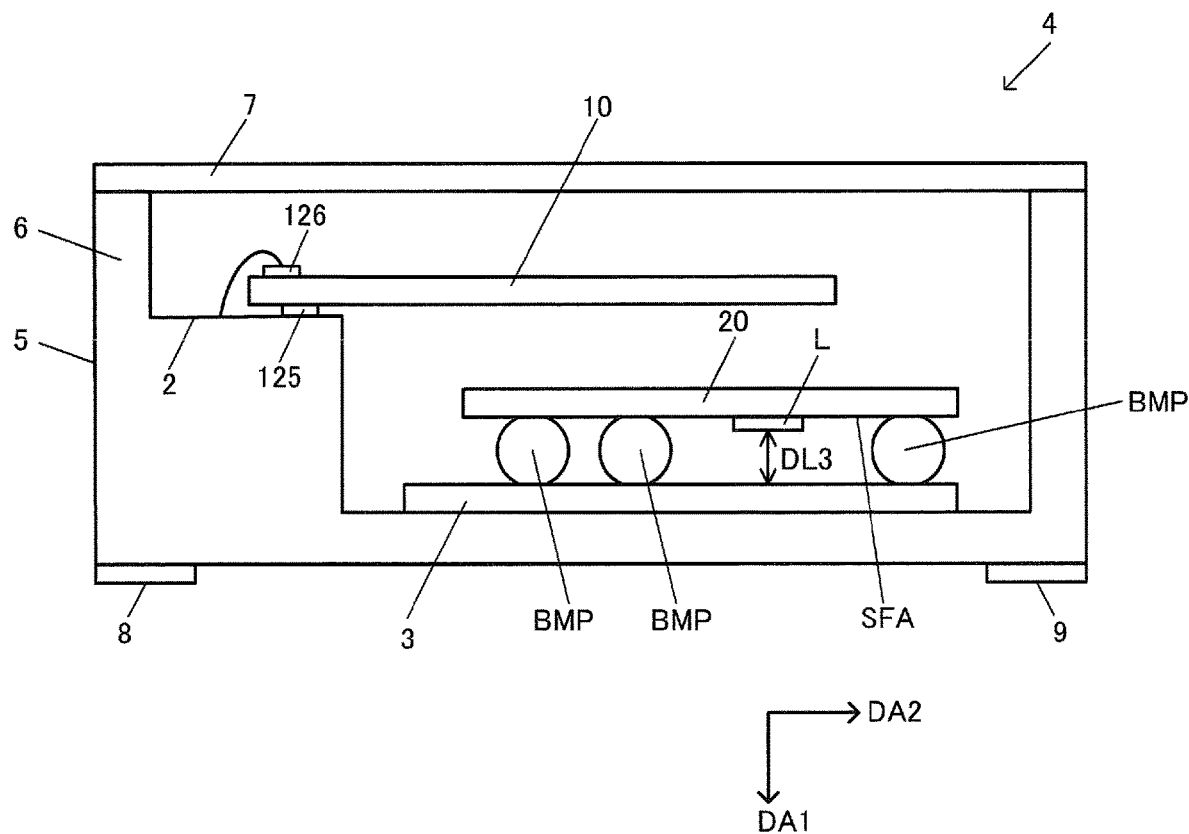
FIG. 18 is a sectional view of a third structure example of the oscillator.

FIG. 18 is a sectional view schematically illustrating a third structure example of the oscillator 4. In FIG. 18, the oscillator 4 includes the package 5 in which the quartz crystal resonator 10 and the circuit device 20 are housed, and a substrate 3 on which the circuit device 20 is mounted. A structure and the like of the package 5 are the same as in FIGS. 15 and 17, and thus, detailed description thereon will be omitted.

In FIG. 18, the circuit device 20 is mounted on the substrate 3 such that the active surface SFA of the circuit device 20 faces the substrate 3, and the inductor L is provided on the active surface SFA of the circuit device 20. A distance DL3 between the inductor L and the substrate 3 is greater than or equal to 150 μm.

In FIG. 18, the substrate 3 is a substrate on which a wiring electrode is formed. A pad which is a terminal of the circuit device 20, and the wiring electrode of the substrate 3 are coupled to each other through a conductive bump BMP. The conductive bump BMP is, for example, a metal bump formed of metal, such as a gold bump, a silver bump, or a copper bump. Alternatively, a resin core bump configured by plating a core of the bump formed of resin with metal may be used as the conductive bump. A terminal for external coupling of the circuit device 20 is electrically coupled to the wiring electrode of the substrate 3 through the conductive bump BMP, and the wiring electrode of the substrate 3 is electrically coupled to the external terminals 8 and 9 of the oscillator 4 through an internal wire or the like of the package 5. This enables electrical coupling between the circuit device 20 and an external device and enables exchange of information between the circuit device 20 and the external device though, for example, the interface circuit 92 illustrated in FIG. 2. Alternatively, supply or the like of power to the circuit device 20 is also possible. The terminal electrodes 125 and 126 of the quartz crystal resonator 10 are electrically coupled to the terminals for connecting a vibrator of the circuit device 20 through the internal wire and the bonding wire of the package 5, the wiring electrode of the substrate 3, and the conductive bumps BMP. Thereby, the quartz crystal resonator 10 and the oscillation circuit 30 of FIGS. 1 and 2 are electrically coupled to each other, and an oscillation operation of the quartz crystal resonator 10 due to the oscillation circuit 30 is possible.

For example, if the distance DL3 between the inductor L provided on the active surface SFA of the circuit device 20 and the substrate 3 is short, a situation occurs in which the magnetic field due to the inductor L is hindered by the wiring electrode of the substrate 3, and thereby, the inductance of the inductor L fluctuates from a design value. As such, if the inductance fluctuates, there is a concern that a situation occurs in which an LC resonance frequency of the voltage control oscillation circuit 50 fluctuates and an oscillation noise is generated or the oscillation operation stops in a worst case. In this respect, if the distance DL3 between the inductor L and the substrate 3 is increased to be greater than or equal to 150 μm, it is possible to suppress that the magnetic field due to the inductor L is hindered by the wiring electrode of the substrate 3 and thereby the inductance fluctuates. Thereby, it is possible to suppress generation of an oscillation noise or to prevent a situation in which an oscillation operation stops from occurring.

FIG. 19 is an explanatory diagram of an experiment in which the distance between the quartz crystal resonator 10 and the inductor L was changed. For example, in FIG. 19, an experiment was performed in which several spacers 22 with an insulating property are stacked between the quartz crystal resonator 10 and an IC of the circuit device 20 to change a distance DL. The insulating spacer 22 is, for example, a tape-shaped member. A polyimide coat 24 is formed above the inductor L. In the circuit device 20, the voltage control oscillation circuit 50 which is an LC oscillation circuit is mounted, and an oscillation frequency and an oscillation noise can be measured.

FIG. 20 illustrates results of the experiment in which the distance between the quartz crystal resonator 10 and the inductor L was changed. That is, in the experiment of FIG. 19, results are obtained in which changes of an oscillation frequency and an oscillation noise are measured when the distance DL is changed. The oscillation frequency is referred to as F0 and the amount of noise is referred to as NO when the quartz crystal resonator 10 is not provided. When the distance DL is 300 μm, the oscillation frequency remains F0, and the noise does not increase and remains NO. When the distance DL is 150 μm, the oscillation frequency changes by +1%. A change of the oscillation noise is within an allowable range. When the distance DL is 0 μm, a normal oscillation is not performed. From these experimental results, it is considered that the distance DL=approximately 150 μm is a distance of a limit value that falls within an allowable range. Thereby, in FIGS. 15 to 17, the distances DL1, DL2, and DL3 are greater than or equal to 150 μm.

4. Structure of Quartz Crystal Resonator

Figure 21:
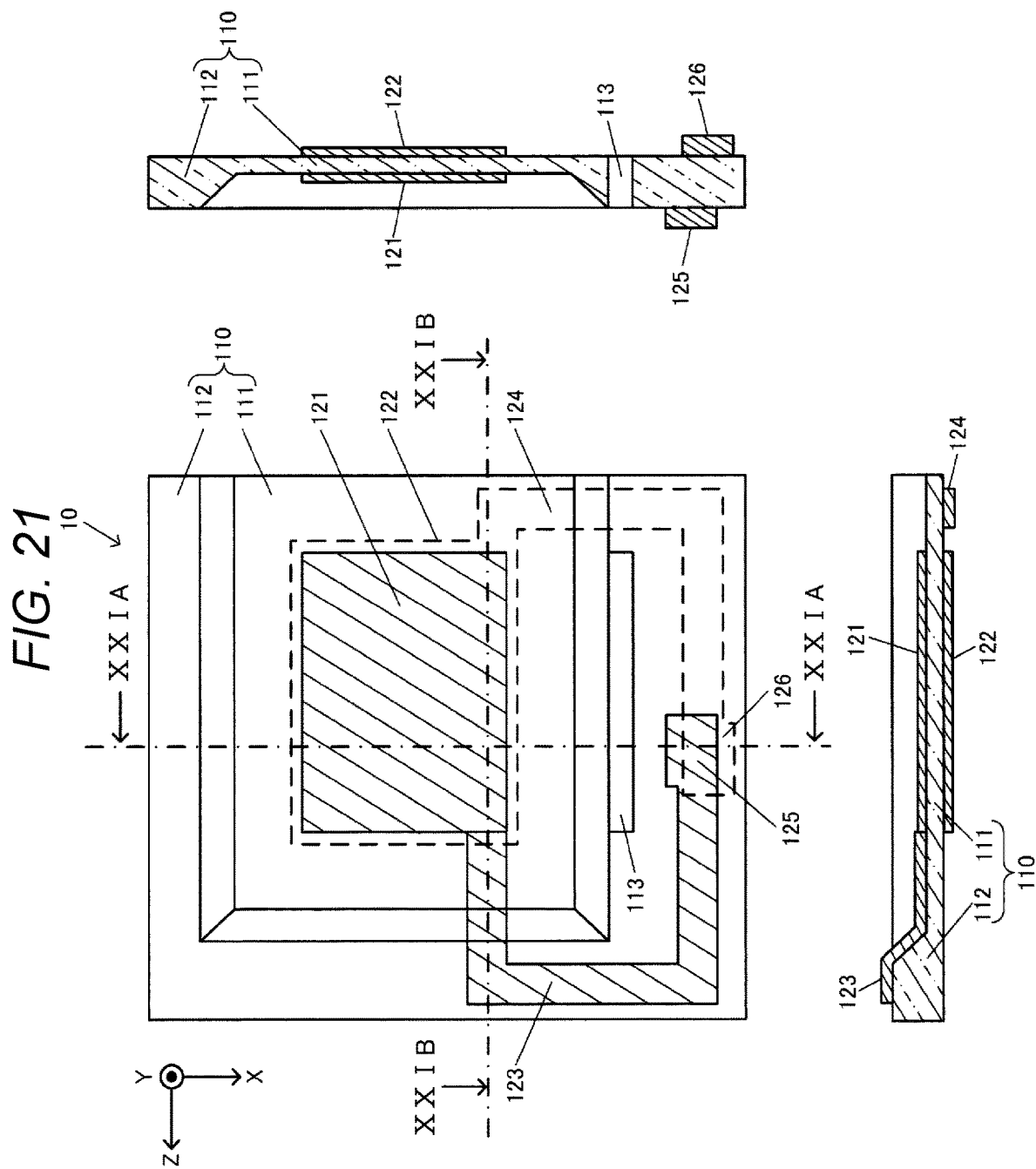
FIG. 21 illustrates a structure example of the quartz crystal resonator.

FIG. 21 illustrates a structure example of the quartz crystal resonator 10. FIG. 21 illustrates a plan diagram of the quartz crystal resonator 10, a sectional diagram taken along the line XXIA-XXIA, and a sectional diagram taken along the line XXIB-XXIB. The quartz crystal resonator 10 includes a piezoelectric substrate 110, excitation electrodes 121 and 122, lead electrodes 123 and 124, and terminal electrodes 125 and 126. The excitation electrode 121, the lead electrode 123, and the terminal electrode 125 configure a first electrode formed on a first main surface of the piezoelectric substrate 110. The excitation electrode 122, the lead electrode 124, and the terminal electrode 126 configure a second electrode formed on a second main surface of the piezoelectric substrate 110. The first main surface is a first vibration surface, and the second main surface is a second vibration surface.

The piezoelectric substrate 110 has a vibration portion 111 formed in a thin flat plate shape in a rectangular plane shape, and a support portion 112 formed to be thicker than the vibration portion 111. The support portion 112 is formed to be coupled to three sides of a rectangular plane of the vibration portion 111. Specifically, the vibration portion 111 has a structure of a form sunk from the support portion 112. A penetration hole 113 is a hole for relieving stress generated in the piezoelectric substrate 110.

In FIG. 21, the excitation electrode 121 which is a first excitation electrode of a thin film is formed on a first main surface which is a first vibration surface of the piezoelectric substrate 110. The excitation electrode 122 which is a second excitation electrode of a thin film is formed on a second main surface which is a second vibration surface of the piezoelectric substrate 110. Specifically, the excitation electrodes 121 and 122 are provided to pinch the vibration portion 111 of the piezoelectric substrate 110 therebetween.

The excitation electrode 121 is electrically coupled to the terminal electrode 125 thicker than the excitation electrode 121 through the lead electrode 123 thicker than the excitation electrode 121. The lead electrode 123 is a first lead electrode, and the terminal electrode 125 is a first terminal electrode. The excitation electrode 122 is coupled to the terminal electrode 126 thicker than the excitation electrode 122 through the lead electrode 124 thicker than the excitation electrode 122. The lead electrode 124 is a second lead electrode, and the terminal electrode 126 is a second terminal electrode. The terminal electrodes 125 and 126 are also called pad electrodes.

As illustrated in FIG. 15, the terminal electrodes 125 and 126 are electrically coupled to the terminals P1 and P2 for coupling the vibrator of the circuit device 20 through an internal wire and a bonding wire of the package 5, and the internal terminals T1 and T2. Thereby, the oscillation circuit 30 of FIGS. 1 and 2 is electrically coupled to the excitation electrodes 121 and 122, and an oscillation operation of the quartz crystal resonator 10 is realized. Specifically, an electric field is generated between the excitation electrode 121 and the excitation electrode 122 by a drive current due to the oscillation circuit 30, and the vibration portion 111 is vibrated by a piezoelectric effect. When the piezoelectric substrate 110 is formed by using quartz crystal belonging to a trigonal piezoelectric material, as illustrated in FIG. 21, the piezoelectric substrate has crystal axes X, Y, and Z orthogonal to each other. The X axis is referred to as an electrical axis, the Y axis is referred to as a mechanical axis, the Z axis is referred to as an optical axis, and a flat plate cut out along a plane obtained by rotating an XZ plane around the X axis by a predetermined angle Θ is used as the piezoelectric substrate 110. For example, in a case of an AT-cut quartz crystal substrate, the angle Θ becomes 35.25 degrees, and the piezoelectric substrate 110 is formed by the AT-cut quartz crystal substrate formed in this manner. The piezoelectric substrate 110 according to the present embodiment is not limited to the AT cut, and may be, for example, a piezoelectric substrate such as a BT cut for exciting thickness-shear vibration.

As described above, in the present embodiment, the quartz crystal resonator 10 includes the piezoelectric substrate 110 having the vibration portion 111, the excitation electrode 121 which is the first excitation electrode, the excitation electrode 122 which is the second excitation electrode, the lead electrode 123 which is the first lead electrode, and the lead electrode 124 which is the second lead electrode. The excitation electrode 121 is provided at a position corresponding to the vibration portion 111 on the first main surface of the piezoelectric substrate 110. The excitation electrode 122 is provided at a position corresponding to the vibration portion 111 on the second main surface of the piezoelectric substrate 110. The lead electrode 123 is provided on the first main surface of the piezoelectric substrate 110, is electrically coupled to the excitation electrode 121, and is an electrode thicker than the excitation electrode 121. The lead electrode 124 is provided on the second main surface of the piezoelectric substrate 110, is electrically coupled to the excitation electrode 122, and is an electrode thicker than the excitation electrode 122.

As described above, in the quartz crystal resonator 10 of FIG. 21, the lead electrodes 123 and 124 are formed to be thicker than the excitation electrodes 121 and 122. That is, in order to improve a vibration performance of the vibration portion 111, the excitation electrodes 121 and 122 are formed as thin as possible, but an ohmic loss that is a loss due to an increase in resistance occurs due to thinning. In order to reduce the ohmic loss, the lead electrodes 123 and 124 are formed to be thicker than the excitation electrodes 121 and 122. The terminal electrodes 125 and 126 are also formed to be thicker than the excitation electrodes 121 and 122. Thereby, it is possible to suppress reduction of a CI value, and to make the quartz crystal resonator 10 oscillate at the high oscillation frequency FXTAL such as a frequency higher than or equal to 200 MHz.

Specifically, each of the excitation electrodes 121 and 122 is formed by stacking a first conductive layer and a second conductive layer. The first conductive layer is formed by using, for example, nickel (N1) having excellent adhesion to the quartz crystal of the piezoelectric substrate 110 as a base layer. The second conductive layer is formed on a surface of the first conductive layer by using gold (AU) as a conductive film.

Meanwhile, each of the lead electrodes 123 and 124 has the first conductive layer and the second conductive layer as a common electrode layer with the excitation electrodes 121 and 122. Then, in order to form the lead electrodes 123 and 124 in a thick film, in each of the lead electrodes 123 and 124, a third conductive layer is stacked on the second electrode layer which is a common electrode layer. For example, a conductive film is formed of gold as the third conductive layer. By doing so, the excitation electrodes 121 and 122 are formed with a thin film, and while a vibration performance of the vibration portion 111 is improved, the lead electrodes 123 and 124 are formed with a thick film, and thereby, the ohmic loss can be reduced. Thereby, it is possible to oscillate the quartz crystal resonator 10 at a high oscillation frequency FXTAL such as a frequency higher than or equal 200 MHz. By forming the first and second conductive layers of the excitation electrodes 121 and 122 and the first and second conductive layers of the lead electrodes 123 and 124 as a common electrode layer, electrical coupling between the excitation electrodes 121 and 122 and the lead electrodes 123 and 124 is reliably performed, and the quartz crystal resonator 10 with a high reliability can be realized.

5. Electronic Apparatus, Vehicle

Figure 22:
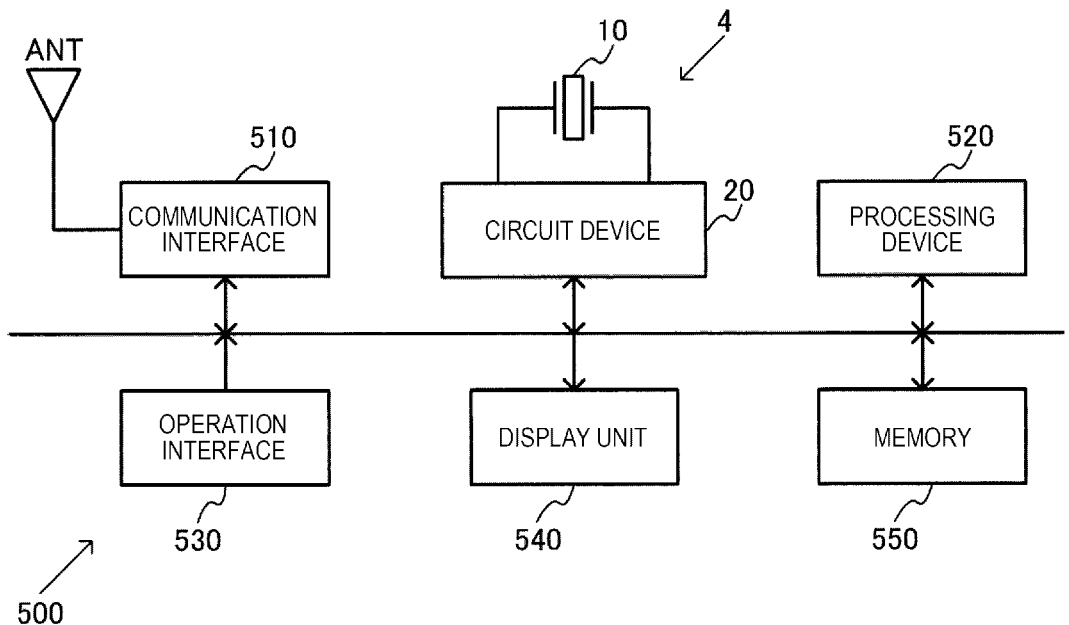
FIG. 22 illustrates a configuration example of an electronic apparatus.

FIG. 22 illustrates a configuration example of an electronic apparatus 500 including the oscillator 4 according to the present embodiment. The electronic apparatus 500 includes the oscillator 4 configured by the quartz crystal resonator 10 and the circuit device 20, and a processing device 520. The electronic apparatus 500 can include an antenna ANT, a communication interface 510, an operation interface 530, a display unit 540, and a memory 550. The electronic apparatus 500 is not limited to the configuration illustrated in FIG. 22, and various modifications, such as omitting some of configuration elements or adding other configuration elements, may be made.

The electronic apparatus 500 is, for example, an apparatus relating to a network such as a base station or a router, a high-accuracy measurement device of measuring physical quantities such as a distance, time, a flow velocity, or a flow rate, a biological information measurement apparatus of measuring biological information, an in-vehicle apparatus, or the like. The biological information measurement apparatus is, for example, an ultrasonic measurement device, a Pulse meter, a blood pressure measurement device, or the like. The in-vehicle apparatus is an apparatus for automatic driving, or the like. The electronic apparatus 500 may be a wearable apparatus such as a head-mounted display device or a watch-related apparatus, a robot, a print device, a projection device, a portable information terminal such as a smartphone, a content providing apparatus of distributing content, or an image apparatus such as a digital camera or a video camera, or the like.

The communication interface 510 receives data from the outside through the antenna ANT and transmits data to the outside. The processing device 520, which is a processor, performs control processing of the electronic apparatus 500, various digital processing of the data transmitted and received through the communication interface 510, and the like. A function of the processing device 520 can be realized by a processor such as a microcontroller. The operation interface 530 is used by a user to perform an input operation and can be realized by an operation button, a touch panel display, or the like. The display unit 540 displays various types of information and can be realized by a display such as a liquid crystal or an organic EL. The memory 550 stores data, and a function thereof can be realized by a semiconductor memory such as a RAM or a ROM.

Figure 23:
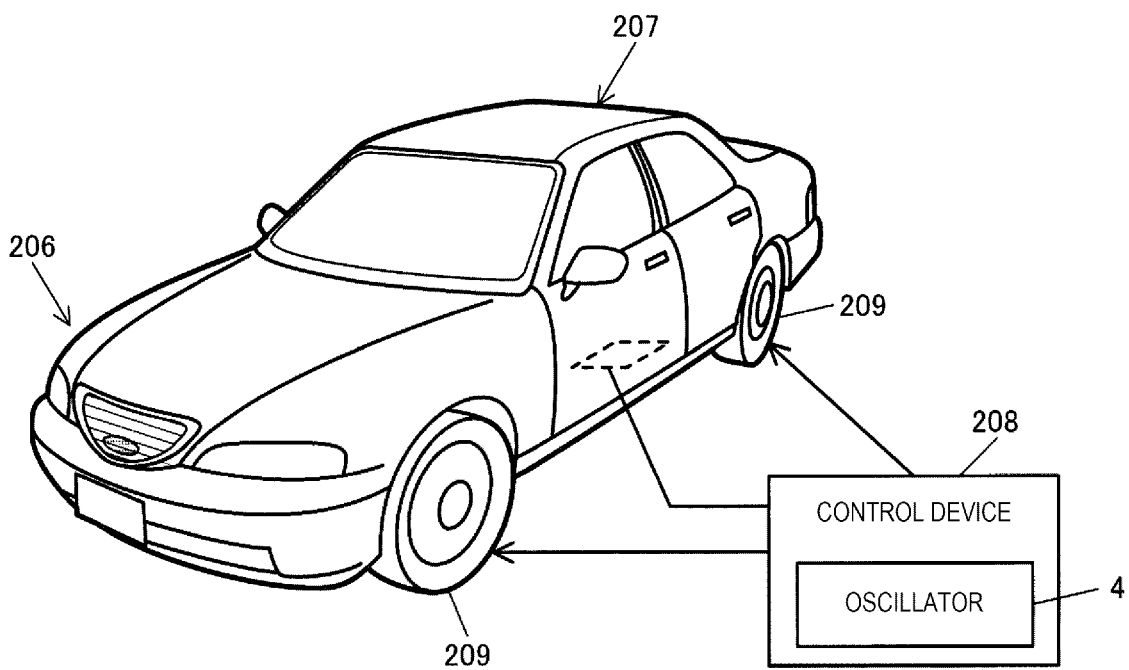
FIG. 23 illustrates a configuration example of a vehicle.

FIG. 23 illustrates an example of a vehicle including the oscillator 4 according to the present embodiment. The oscillator 4 according to the present embodiment can be incorporated into various vehicles such as a car, an airplane, a motorcycle, a bicycle, or a ship. The vehicle includes a drive mechanism such as an engine or a motor, a steering mechanism such as a steering wheel or a rudder, and various electronic apparatuses and is, for example, an apparatus or a device that moves on the ground, in the sky, or in the sea. FIG. 23 schematically illustrates an automobile 206 as an example of the vehicle. The oscillator 4 according to the present embodiment is incorporated into the automobile 206. A control device 208 operates in response to a clock signal generated by the oscillator 4. The control device 208 controls hardness of a suspension or controls a brake of an individual wheel 209 according to, for example, a posture of a vehicle body 207. For example, the control device 208 may realize automatic driving of the automobile 206. The apparatus into which the oscillator 4 according to the present embodiment is incorporated is not limited to the control device 208 and can be incorporated into various in-vehicle apparatuses such as a meter panel apparatus and a navigation apparatus which are provided in the vehicle such as the automobile 206.

As described above, the oscillator according to the present embodiment includes a quartz crystal resonator and a circuit device electrically coupled to the quartz crystal resonator, and the circuit device includes an oscillation circuit that generates a reference clock signal by oscillating the quartz crystal resonator, and a PLL circuit that receives the reference clock signal. The PLL circuit includes a phase comparison circuit that performs a phase comparison between the reference clock signal and a feedback clock signal, a control voltage generation circuit that generates a control voltage based on a result of the phase comparison, a voltage control oscillation circuit that generates a clock signal with a frequency corresponding to the control voltage, and a frequency division circuit that divides a frequency of the clock signal and outputs the feedback clock signal. An oscillation frequency of the quartz crystal resonator is higher than or equal to 200 MHz, and a phase comparison frequency of the phase comparison circuit is higher than or equal to 200 MHz.

According to the present embodiment, the reference clock signal is generated by the quartz crystal resonator having the oscillation frequency higher than or equal to 200 MHz, and the phase comparison between the generated reference clock signal and the feedback clock signal is performed at the phase comparison frequency higher than or equal to 200 MHz. By doing so, even if components of the phase comparison frequency become a reference leak noise and leaks to an output of the PLL circuit, by increasing the phase comparison frequency to a frequency higher than or equal to 200 MHz, the reference leak noise is out of a measurement range of a phase noise, and noise reduction can be realized. By increasing the phase comparison frequency to a frequency higher than or equal to 200 MHz, it is possible to reduce the multiplication number of the PLL circuit, to reduce a noise in a band of the PLL circuit, and to realize the noise reduction.

In the present embodiment, the PLL circuit may receive frequency division ratio data for determining a frequency of the clock signal, perform a delta sigma modulation based on the frequency division ratio data, and include a delta signal modulation circuit that sets a frequency division ratio of a frequency division circuit.

By doing so, it is possible to realize a fractional-N type PLL circuit, and to set not only an integer but also a fraction as the frequency division ratio. By setting the phase comparison frequency to a frequency higher than or equal to 200 MHz, it is possible to make a frequency in which a noise of the delta sigma modulation appears be out of the measurement range of the phase noise, and to realize the noise reduction.

In the present embodiment, an operation frequency of the delta sigma modulation circuit may be higher than or equal to 200 MHz.

By doing so, even if a noise of the delta sigma modulation is generated by the delta sigma modulation circuit, a frequency at which the noise of the delta sigma modulation appears is higher than or equal to 100 MHz, and thus, the frequency falls out of the measurement range of the phase noise and the noise reduction can be realized.

In the present embodiment, the delta sigma modulation circuit may include an arithmetic circuit that performs operation of the delta sigma modulation, and a hold circuit that holds an operation result of the operation circuit, the arithmetic circuit may output the operation result in synchronization with the feedback clock signal, and the hold circuit may hold the operation result in synchronization with the feedback clock signal and may output the held operation result to the frequency division circuit.

By doing so, even when the phase comparison frequency becomes a high frequency and an operation frequency of the delta sigma modulation circuit also becomes a high frequency, it is possible to properly hold the operation result in the hold circuit by properly ending arithmetic processing of the delta sigma modulation within one clock cycle.

In the present embodiment, a loop bandwidth of the PLL circuit may be larger than 0.5 MHz.

As described above, by increasing the loop bandwidth of the PLL circuit to be larger than 0.5 MHz as described above, it is possible to reduce an area of a low pass filter which becomes a loop filter of the PLL circuit, and to reduce an area of a circuit device.

In the present embodiment, a voltage control oscillation circuit may be an LC oscillation circuit including an inductor and a capacitor, and the inductor of the LC oscillation circuit may be configured by a metal wiring layer of the circuit device.

As described above, if the LC oscillation circuit is used as the voltage control oscillation circuit, an oscillation operation of the voltage control oscillation circuit can be realized at a high oscillation frequency corresponding to the high phase comparison frequency. By forming the inductor with a metal wiring layer of a circuit device, it is not necessary to use the inductor of an external component, and a compact oscillator can be made.

In the present embodiment, a package may be provided in which a quartz crystal resonator and a circuit device are housed, the quartz crystal resonator and the circuit device may be disposed in a package such that an active surface of the circuit device faces the quartz crystal resonator, the inductor may be provided on the active surface of the circuit device, and a distance between the inductor and the quartz crystal resonator may be greater than or equal to 150 µm.

As described above, if the distance between the inductor and the quartz crystal resonator is increased to be greater than or equal to 150 µm, it is possible to suppress that a magnetic field due to the inductor is hindered by an electrode and the like of the quartz crystal resonator and thereby inductance fluctuates and to perform suppression and the like of generation of an oscillation noise.

In the present embodiment, a quartz crystal resonator and a circuit device may be housed in a package, an inductor may be provided on an active surface of the circuit device, the active surface of the circuit device may face the quartz crystal resonator, and the quartz crystal resonator and the circuit device may be disposed in the package such that the inductor and the quartz crystal resonator do not overlap each other in a direction orthogonal to the active surface in plan view.

As described above, if the inductor and the quartz crystal resonator are disposed so as not to overlap each other in plan view, a distance between the inductor and the quartz crystal resonator can be increased, and it is possible to suppress that a magnetic field due to the inductor is hindered by an electrode and the like of the quartz crystal resonator and thereby inductance fluctuates and to perform suppression and the like of generation of an oscillation noise.

In the present embodiment, a package may be provided in which a quartz crystal resonator and a circuit device are housed, the circuit device may have a first side and a second side which is an opposite side of the first side, the first side may be disposed at a position closer to the quartz crystal resonator than is the second side in plan view in a direction orthogonal to the active surface of the first side, the quartz crystal resonator may be disposed at a position closer to the first side than is the inductor, and the quartz crystal resonator and the circuit device may be disposed in the package such that the inductor is disposed closer to the second side than is the quartz crystal resonator.

As described above, if the quartz crystal resonator is disposed at a position close to the first side in plan view and the inductor is disposed at a position close to the second side, a distance between the inductor and the quartz crystal resonator can be increased, and it is possible to suppress that a magnetic field due to the inductor is hindered by an electrode and the like of the quartz crystal resonator and thereby inductance fluctuates, and to perform suppression and the like of generation of an oscillation noise.

In the present embodiment, there may be provided a package in which a quartz crystal resonator and a circuit device are housed and a substrate on which the circuit device is mounted, the circuit device may be mounted on the substrate such that an active surface of the circuit device faces the substrate, the inductor may be provided on the active surface of the circuit device, and a distance between the inductor and the substrate may be greater than or equal to 150 µm.

As described above, if the distance between the inductor and the substrate is increased to be greater than or equal to 150 µm, it is possible to suppress that a magnetic field due to the inductor is hindered by an electrode and the like of the quartz crystal resonator and thereby inductance fluctuates, and to perform suppression and the like of generation of an oscillation noise.

In the present embodiment, the quartz crystal resonator may include a piezoelectric substrate having a vibration portion, a first excitation electrode provided at a position corresponding to the vibration portion on a first main surface of the piezoelectric substrate, a second piezoelectric substrate, a second excitation electrode provided at a position corresponding to the vibration portion on a second main surface of the piezoelectric substrate, a first lead electrode which is provided on the first main surface of the piezoelectric substrate and is electrically coupled to the first excitation electrode and is thicker than the first excitation electrode, and a second lead electrode which is provided on the second main surface of the piezoelectric substrate and is electrically coupled to the second excitation electrode and is thicker than the second excitation electrode.

As described above, if the first and second lead electrodes are thicker than the first and second excitation electrodes, it is possible to reduce an ohmic loss, to suppress reduction of a CI value, and to oscillate a quartz crystal resonator at a high oscillation frequency such as a frequency higher than or equal to 200 MHz.

The present embodiment relates to an electronic apparatus including the oscillator described above.

The present embodiment relates to a vehicle including the oscillator described above.

As described above, although the embodiments are described in detail, it will be readily understood by those skilled in the art that various modifications can be made without departing substantially from the novel items and effects of the present disclosure. Accordingly, all such modifications are included within the scope of the present disclosure. For example, in the specification or the drawings, a term described together with a broader or synonymous different term at least once can be replaced with a different term anywhere in the specification or the drawings. All combinations of the present embodiment and the modifications are also included in the scope of the present disclosure. A configuration, an operation, and the like of an oscillator, a circuit device, an oscillation circuit, a PLL circuit, an electronic apparatus, and a vehicle are not limited to those described in the present embodiment, and various modifications can be made.

What is claimed is:

1. An oscillator comprising:
   a quartz crystal resonator that performs a thickness-shear vibration, the quartz crystal resonator including:
      a piezoelectric substrate including a vibration portion formed in a thin flat plate and a support portion formed to be thicker than the vibration portion;
      a first excitation electrode provided at a position corresponding to the vibration portion in a first main surface of the piezoelectric substrate; and
      a second excitation electrode provided at a position corresponding to the vibration portion in a second main surface of the piezoelectric substrate; and
   a circuit device electrically coupled to the quartz crystal resonator, wherein
   the circuit device includes an oscillation circuit that generates a reference clock signal by oscillating the quartz crystal resonator, and a PLL circuit that receives the reference clock signal,
   the PLL circuit includes a phase comparison circuit that performs a phase comparison between the reference clock signal and a feedback clock signal, a control voltage generation circuit that generates a control voltage based on a result of the phase comparison, a voltage control oscillation circuit that generates a clock signal having a frequency corresponding to the control voltage, and a frequency division circuit that divides a frequency of the clock signal and outputs the feedback clock signal, and
   an oscillation frequency of the quartz crystal resonator is higher than or equal to 200 MHz, and a phase comparison frequency of the phase comparison circuit is higher than or equal to 200 MHz.

2. The oscillator according to claim 1, wherein the PLL circuit includes a delta sigma modulation circuit that receives frequency division ratio data for determining the frequency of the clock signal, performs a delta sigma modulation based on the frequency division ratio data, and sets a frequency division ratio of the frequency division circuit.

3. The oscillator according to claim 2, wherein an operation frequency of the delta sigma modulation circuit is higher than or equal to 200 MHz.

4. The oscillator according to claim 2, wherein
   the delta sigma modulation circuit includes an arithmetic circuit that performs an operation of the delta sigma modulation, and a hold circuit that holds an operation result of the arithmetic circuit,
   the arithmetic circuit outputs the operation result in synchronization with the feedback clock signal, and
   the hold circuit holds the operation result in synchronization with the feedback clock signal and outputs the held operation result to the frequency division circuit.

5. An oscillator comprising:
   a quartz crystal resonator; and
   a circuit device electrically coupled to the quartz crystal resonator, wherein
   the circuit device includes an oscillation circuit that generates a reference clock signal by oscillating the quartz crystal resonator, and a PLL circuit that receives the reference clock signal,
   the PLL circuit includes a phase comparison circuit that performs a phase comparison between the reference clock signal and a feedback clock signal, a control voltage generation circuit that generates a control voltage based on a result of the phase comparison, a voltage control oscillation circuit that generates a clock signal having a frequency corresponding to the control voltage, and a frequency division circuit that divides a frequency of the clock signal and outputs the feedback clock signal,
   an oscillation frequency of the quartz crystal resonator is higher than or equal to 200 MHz, and a phase comparison frequency of the phase comparison circuit is higher than or equal to 200 MHz, and
   a loop bandwidth of the PLL circuit is greater than 0.5 MHz.

6. The oscillator according to claim 1, wherein
   the voltage control oscillation circuit is an LC oscillation circuit including an inductor and a capacitor, and
   the inductor of the LC oscillation circuit is formed by a metal wiring layer of the circuit device.

7. The oscillator according to claim 6, further comprising:
   a package in which the quartz crystal resonator and the circuit device are housed, wherein
   the quartz crystal resonator and the circuit device are disposed in the package such that an active surface of the circuit device faces the quartz crystal resonator,
   the inductor is provided on the active surface of the circuit device, and
   a distance between the inductor and the quartz crystal resonator is greater than or equal to 150 µm.

8. The oscillator according to claim 6, further comprising:
a package in which the quartz crystal resonator and the circuit device are housed, wherein
the inductor is provided in an active surface of the circuit device, and
the quartz crystal resonator and the circuit device are disposed in the package such that the active surface of the circuit device faces the quartz crystal resonator, and the inductor and the quartz crystal resonator do not overlap each other in plan view in a direction orthogonal to the active surface.

9. The oscillator according to claim 6, further comprising:
a package in which the quartz crystal resonator and the circuit device are housed, wherein
the circuit device has a first side and a second side which is an opposite side of the first side, and
the quartz crystal resonator and the circuit device are disposed in the package such that the first side is closer to the quartz crystal resonator than is the second side, the quartz crystal resonator is closer to the first side than is the inductor, and the inductor is closer to the second side than is the quartz crystal resonator in plan view in a direction orthogonal to an active surface of the circuit device.

10. The oscillator according to claim 6, further comprising:
a package in which the quartz crystal resonator and the circuit device are housed; and
a substrate in which the circuit device is mounted, wherein
the circuit device is mounted in the substrate such that an active surface of the circuit device faces the substrate,
the inductor is provided in the active surface of the circuit device, and
a distance between the inductor and the substrate is greater than or equal to 150 μm.

11. An oscillator comprising:
a quartz crystal resonator; and
a circuit device electrically coupled to the quartz crystal resonator, wherein
the circuit device includes an oscillation circuit that generates a reference clock signal by oscillating the quartz crystal resonator, and a PLL circuit that receives the reference clock signal,
the PLL circuit includes a phase comparison circuit that performs a phase comparison between the reference clock signal and a feedback clock signal, a control voltage generation circuit that generates a control voltage based on a result of the phase comparison, a voltage control oscillation circuit that generates a clock signal having a frequency corresponding to the control voltage, and a frequency division circuit that divides a frequency of the clock signal and outputs the feedback clock signal,
an oscillation frequency of the quartz crystal resonator is higher than or equal to 200 MHz, and a phase comparison frequency of the phase comparison circuit is higher than or equal to 200 MHz, and
the quartz crystal resonator includes:
a piezoelectric substrate having a vibration portion;
a first excitation electrode provided at a position corresponding to the vibration portion in a first main surface of the piezoelectric substrate;
a second excitation electrode provided at a position corresponding to the vibration portion in a second main surface of the piezoelectric substrate;
a first lead electrode which is provided in the first main surface of the piezoelectric substrate, is electrically coupled to the first excitation electrode, and is thicker than the first excitation electrode; and
a second lead electrode which is provided in the second main surface of the piezoelectric substrate, is electrically coupled to the second excitation electrode, and is thicker than the second excitation electrode.

12. An electronic apparatus comprising:
the oscillator according to claim 1.

13. A vehicle comprising:
the oscillator according to claim 1.

* * * * *